(12) United States Patent
Choi et al.

(10) Patent No.: US 12,021,411 B2
(45) Date of Patent: Jun. 25, 2024

(54) AUXILIARY POWER MANAGEMENT DEVICE AND ELECTRONIC SYSTEM INCLUDING THE SAME

(71) Applicant: SK hynix Inc., Icheon-si (KR)

(72) Inventors: Eun Kyu Choi, Icheon-si (KR); Seon Cheol Kim, Icheon-si (KR); Sung Ryun Moon, Icheon-si (KR); In Bo Shim, Icheon-si (KR); Joon Hwan Oh, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 301 days.

(21) Appl. No.: 17/348,549

(22) Filed: Jun. 15, 2021

(65) Prior Publication Data

US 2022/0209573 A1 Jun. 30, 2022

(30) Foreign Application Priority Data

Dec. 30, 2020 (KR) ........................ 10-2020-0187292

(51) Int. Cl.
*H02J 9/06* (2006.01)
*G11C 5/14* (2006.01)
*H02J 1/10* (2006.01)

(52) U.S. Cl.
CPC .............. *H02J 9/068* (2020.01); *G11C 5/141* (2013.01); *H02J 1/10* (2013.01)

(58) Field of Classification Search
CPC ...... H02J 1/10; H02J 7/34; H02J 7/345; H02J 9/068; H02J 9/06; H02J 7/0029;
(Continued)

(56) References Cited

U.S. PATENT DOCUMENTS

| | | | |
|---|---|---|---|
| 2013/0193768 A1* | 8/2013 | Iwasaki | H02J 7/35 307/85 |
| 2014/0002003 A1* | 1/2014 | Kim | H02J 7/0019 429/61 |

(Continued)

FOREIGN PATENT DOCUMENTS

| | | |
|---|---|---|
| KR | 100848202 B1 | 7/2008 |
| KR | 1020120105155 | 9/2012 |

(Continued)

*Primary Examiner* — Rexford N Barnie
*Assistant Examiner* — Rasem Mourad
(74) *Attorney, Agent, or Firm* — Perkins Coie LLP

(57) ABSTRACT

Auxiliary power management devices are disclosed. In some implementations, an auxiliary power management device may be coupled to an auxiliary power source that serves as a backup power supply for a primary power source to provide power to an electronic device and comprising a plurality of switches to control currents of a plurality of energy storage components, a plurality of channels coupled to the plurality of switches, respectively, a plurality of switch controllers to control the plurality of switches coupled to the plurality of channels and monitor a current or voltage of the plurality of channels, and a management logic to control the switches coupled to the plurality of channels upon detection, by the plurality of switch controllers, of a first current or voltage distribution across the channels that exceeds a predetermined threshold regarding the current or voltage distribution.

18 Claims, 13 Drawing Sheets

(58) Field of Classification Search
CPC ....... H02J 7/00714; H02J 9/061; G11C 5/141; G11C 5/14
See application file for complete search history.

(56) References Cited

U.S. PATENT DOCUMENTS

| | | | |
|---|---|---|---|
| 2015/0318582 A1* | 11/2015 | Brockman | H01M 10/425 |
| | | | 320/137 |
| 2017/0117718 A1* | 4/2017 | Yeh | H02J 7/0063 |
| 2017/0126973 A1* | 5/2017 | Skeoch | H02J 7/34 |
| 2018/0059761 A1* | 3/2018 | An | G06F 13/4068 |
| 2018/0090941 A1* | 3/2018 | Ramachandran | H01M 10/488 |
| 2018/0308527 A1* | 10/2018 | Narayanan | G11C 5/148 |
| 2019/0181679 A1* | 6/2019 | Northway | H02J 3/00 |
| 2020/0144845 A1* | 5/2020 | Facchini | H02J 50/12 |
| 2020/0169105 A1* | 5/2020 | Watanabe | H02J 7/00306 |
| 2022/0171445 A1* | 6/2022 | Kim | G06F 1/266 |

FOREIGN PATENT DOCUMENTS

| | | |
|---|---|---|
| KR | 1020180024615 | 3/2018 |
| KR | 101837548 B1 | 4/2018 |

* cited by examiner

AUXILIARY POWER MANAGEMENT DEVICE AND ELECTRONIC SYSTEM INCLUDING THE SAME

CROSS-REFERENCE TO RELATED APPLICATION

This patent document claims the priority and benefits of Korean Patent Application No. 10-2020-0187292 filed on Dec. 30, 2020, which is incorporated herein by reference in its entirety.

TECHNICAL FIELD

The embodiments of the disclosed technology relate to an auxiliary power management device and an electronic system including the same.

BACKGROUND

Electronic devices or systems require power to operate. Portable electronic devices such as mobile phones, digital cameras, and laptop computers can be designed to receive power from an external power source and/or a rechargeable battery pack. These portable electronic devices generally use a memory system having semiconductor memory devices as its data storage medium. A memory system may be used as a main memory device or an auxiliary memory device of a portable electronic device.

Such a semiconductor-based memory system provides advantages over the traditional hard disk drives since semiconductor memory devices have no mechanical driving and thus offer excellent stability and durability, high data rate, and low power consumption. Examples of semiconductor-based memory systems include universal serial bus (USB) memory devices, memory cards, and solid state drives (SSD).

SUMMARY

The embodiments of the disclosed technology relate to an auxiliary power management device of an electronic system that can handle the sudden power drop or shut down, improving the reliability of the electronic system by facilitating the safe system shutdown.

The auxiliary power management device implemented based on some embodiments of the disclosed technology can detect in real time defects of an energy storage component or a power supply that provides auxiliary power upon failure of the primary power source and control a current flowing to the energy storage component or the power supply upon detection of a defect in the energy storage component or the power supply.

In some embodiments of the disclosed technology, an auxiliary power management device may include an auxiliary power management device coupled to the auxiliary power source and comprising a plurality of switches to control currents of a plurality of energy storage components to serve as a backup power supply for a primary power source to provide power to an electronic device, a plurality of channels coupled to the plurality of switches, respectively, a plurality of switch controllers to control the plurality of switches coupled to the plurality of channels and monitor a current or voltage of the plurality of channels, and a management logic to control the switches coupled to the plurality of channels upon detection, by the plurality of switch controllers, of a first current or voltage distribution across the channels that exceeds a predetermined threshold regarding the current or voltage distribution.

In one example, the detection of the first current or voltage distribution includes determining whether a number of channels that carry a current higher than a first threshold current and lower than a warning threshold current is equal to or less than a predetermined number for a predetermined period of time, and wherein the management logic controls one or more of the switch controllers corresponding to one or more of the switches coupled to one or more of the channels that carry the current higher than the first threshold current and lower than the warning threshold current to switch off the one or more switches.

In another example, the detection of the first current or voltage distribution includes determining whether a number of switches having a voltage lower than a second threshold corresponding to a threshold defining a range of a normal voltage level is equal to or less than a predetermined number for a predetermined period of time, and wherein the management logic controls one or more of the switch controllers to switch off one or more of the switches that have the voltage lower than the second threshold.

In another example, each of the plurality of switch controllers monitors the current, the voltage and a temperature of a corresponding channel, and controls a corresponding switch coupled to a corresponding channel so that the corresponding switch is in an on state, a current-limited state, or an off state, based on at least one of the current, the voltage and the temperature of the corresponding channel, wherein the current-limited state has a higher resistance value than the on state.

In another example, the management logic obtains state information of the energy storage components corresponding to the plurality of channels from the plurality of switch controllers in response to interrupt signals from the plurality of switch controllers.

In another example, each of the switch controllers monitors the current, the voltage and the temperature of the corresponding channel even when the corresponding switch is switched off, determines that the corresponding energy storage component is in a normal state, a warning state requiring a warning, or a defect state indicating the corresponding energy storage component has a defect, based on the monitoring of the current, the voltage and the temperature, and provides the state information of the energy storage component to the management logic.

In another example, the auxiliary power management device may further comprise a nonvolatile memory device to store state information of the plurality of switches coupled to the plurality of channels upon termination of power supply from the primary power source, wherein when the primary power source resumes power supply, the management logic obtains the state information of the switch from the nonvolatile memory device, and provides the state information to the corresponding switch controller, and each of the switch controllers sets the corresponding switch coupled to the corresponding channel to the on state, and sets a state of the corresponding switch based on the state information received from the management logic.

In another example, each of the switch controllers controls a state of the corresponding switch based on a plurality of thresholds for the current, the voltage and the temperature of the corresponding channel, and the management logic obtains the plurality of thresholds from an external device or an external resistance value, and provides the plurality of thresholds to the switch controllers.

In another example, the switch is a low-side switch.

In some embodiments of the disclosed technology, an electronic system may include an electronic device, an auxiliary power supply comprising a plurality of channels coupled to a plurality of energy storage components and a plurality of switches to control the plurality of switches coupled to the plurality of channels upon detection of a first current or voltage distribution across the channels that exceeds a predetermined threshold regarding the current or voltage distribution, and each of the switch controllers sets the corresponding switch coupled to the corresponding channel to the on state, and sets a state of the corresponding switch based on the state information received from the management logic.

In one example, the auxiliary power supply comprises a plurality of switch controllers to control the plurality of switches coupled to the plurality of channels, respectively, and monitor the channel current and the channel voltage, and a management logic to detect the first current or voltage distribution across the channels by determining a number of channels that carry a current higher than a first threshold current and lower than a warning threshold current is equal to or less than a predetermined number for a predetermined period of time, and control one or more of the switch controllers corresponding to one or more of the switches coupled to one or more of the channels that carry the current higher than the first threshold current and lower than the warning threshold current to switch off the one or more switches.

In another example, the detection of the first current or voltage distribution includes determining whether a number of switches having a current lower than a second threshold corresponding to a threshold defining a range of a normal voltage level is equal to or less than a predetermined number for a predetermined period of time, and wherein the management logic switches off one or more of the switches that have the voltage lower than the second threshold.

In another example, the auxiliary power supply comprises a plurality of switch controllers to monitor the current, the voltage and a temperature of a corresponding channel, and control a corresponding switch coupled to a corresponding channel so that the corresponding switch is in an on state, a current-limited state, or an off state, based on at least one of the current, the voltage and the temperature of the corresponding channel, wherein the current-limited state has a higher resistance value than the on state.

In another example, the auxiliary power supply further comprises a management logic suitable for obtaining state information of the energy storage components corresponding to the plurality of channels from the plurality of switch controllers in response to interrupt signals from the plurality of switch controllers.

In another example, the management logic indicates an interrupt for an energy storage component in a warning state requiring a warning, among the energy storage components of the plurality of channels, to an electronic device, and the electronic device provides a control signal to the management logic to change a state of the switch corresponding to the energy storage component to the off state, upon a detection of the warning state of the energy storage component based on the interrupt.

In another example, each of the switch controllers monitors the current, the voltage and the temperature of the corresponding channel even when the corresponding switch is switched off, determines that the corresponding energy storage component is in a normal state, a warning state requiring a warning, or a defect state indicating the corresponding energy storage component has a defect based on the monitoring of the current, the voltage and the temperature, and provides the state information of the energy storage component to the management logic.

In another example, the management logic indicates an interrupt for an energy storage component corresponding to a switch in the off state, to an electronic device when the energy storage component is in the defect state, and the electronic device provides a warning signal to a user based on the interrupt.

In another example, the auxiliary power supply further comprises a nonvolatile memory device to store state information of the plurality of switches coupled to the plurality of channels upon termination of power supply from the primary power source, and a management logic to obtain the state information of a corresponding switch from the nonvolatile memory device and provide the information to a corresponding switch controller, when the primary power source resumes power supply, wherein each of the switch controllers sets the corresponding switch coupled to a corresponding channel to the on state, and sets a state of the corresponding switch based on the state information received from the management logic.

In another example, each of the switch controllers controls a state of the corresponding switch based on a plurality of thresholds for the current, the voltage and the temperature of the corresponding channel, and the auxiliary power supply further comprises a management logic to obtain the plurality of thresholds from an external device or an external resistance value, and provide the plurality of thresholds to the switch controllers.

In another example, wherein the switch is a low-side switch.

In some embodiments of the disclosed technology, there is provided an auxiliary power management device which manages a plurality of energy storage components to provide auxiliary power in case of a sudden cut-off of external power to an electronic device. The auxiliary power supply may include: a plurality of switches suitable for controlling currents of the respective energy storage components; a plurality of channels to which the respective switches are coupled; a plurality of switch controllers each suitable for controlling a switch coupled to the corresponding channel, and monitoring a channel current and a channel voltage; and a management logic suitable for controlling the switches coupled to the plurality of channels in response to detection of asymmetry among the channel currents or the channel voltages of the respective channels, obtained from the plurality of switch controllers.

The management logic may detect the asymmetry among the channel currents by detecting that the state in which the number of channels, through which a current having a quasi-normal level higher than a first threshold flows, among the plurality of channels is equal to or less than a predetermined number lasts for a predetermined time or more, and control the switch controller corresponding to the switch coupled to the channel through which the current having the quasi-normal level flows, such that the state of the switch is changed to a switch off state.

The management logic may detect the asymmetry among the channel voltages by detecting that the state in which the number of switches, to which a voltage having a normal level lower than a second threshold is applied, is equal to or less than a predetermined number lasts for a predetermined time or more, and control the switch controller to change the state of the switch, coupled to the channel having a normal-level voltage, to the switch off state.

The plurality of switch controllers may each monitor the channel current, the channel voltage and the channel temperature of the corresponding channel, and control the switch, coupled to the channel, to have any one state of a switch on state, a current-limited state and a switch off state, based on the channel current, the channel voltage and the channel temperature, wherein the current-limited state indicates the state in which the switch is shorted, but the resistance value of the switch is larger than in the switch on state.

The management logic may obtain state information of the energy storage components corresponding to the respective channels from the plurality of switch controllers in response to interrupt signals from the plurality of switch controllers.

Each of the switch controllers may continuously monitor the channel current, the channel voltage and the channel temperature of the corresponding channel even when the corresponding switch is in the switch off state, determine the state of the corresponding energy storage component as any one of a normal state, a warning state and a defect state according to the monitoring result, and provide the state information of the energy storage component to the management logic.

The auxiliary power management device may further include a nonvolatile memory device suitable for storing the state information of the switches coupled to the respective channels when the supply of the external power is removed. When the external power is supplied again, the management logic may obtain the state information of the switch from the nonvolatile memory device, and provide the obtained information to the corresponding switch controller, and each of the switch controllers may set the switch coupled to the corresponding channel to the switch on state when the external power is supplied, and set the state of the switch based on the state information received from the management logic when the state information is received.

Each of the switch controllers may control the state of the corresponding switch based on a plurality of thresholds for the channel current, the channel voltage and the channel temperature, which correspond thereto, and the management logic may obtain the plurality of thresholds from an external device or an external resistance value, and provide the plurality of thresholds to the switch controllers.

The switch may be a low-side switch.

In some embodiments of the disclosed technology, an electronic system may include: an electronic device; an auxiliary power supply comprising a plurality of channels to which energy storage components and switches are coupled, and suitable for controlling the switches coupled to the plurality of channels in response to detection of asymmetry among channel currents or channel voltages of the respective channels; and a main power supply suitable for charging the auxiliary power supply using external power during a normal operation, and providing auxiliary power of the auxiliary power supply to the electronic device in case of a sudden cut-off of the external power.

The auxiliary power supply may include: a plurality of switch controllers each suitable for controlling the switch coupled to the corresponding channel, and monitoring the channel current and the channel voltage; and a management logic suitable for detecting the asymmetry among the channel currents by detecting that the state in which the number of channels, through which a current having a quasi-normal level higher than a first threshold flows, among the plurality of channels is equal to or less than a predetermined number lasts for a predetermined time or more, and controlling the switch controller corresponding to the switch coupled to the channel through which the current having the quasi-normal level flows, such that the state of the switch is changed to a switch off state.

The management logic may detect the asymmetry among the channel voltages by detecting that the state in which the number of switches, to which a current having a normal level lower than a second threshold is applied, is equal to or less than a predetermined number lasts for a predetermined time or more, and change the switch, coupled to the channel having a normal-level voltage, to the switch off state.

The auxiliary power supply may include a plurality of switch controllers each suitable for monitoring the channel current, the channel voltage and the channel temperature of the corresponding channel, and controlling the switch, coupled to the channel, to have any one state of a switch on state, a current-limited state and a switch off state, based on the channel current, the channel voltage and the channel temperature, wherein the current-limited state indicates the state in which the switch is shorted, but the resistance value of the switch is larger than in the switch on state.

The auxiliary power supply may further include a management logic suitable for obtaining state information of the energy storage components of the respective channels from the plurality of switch controllers in response to interrupt signals from the plurality of switch controllers.

The management logic may assert an interrupt for an energy storage component in a warning state, among the energy storage components of the respective channels, to an electronic device, and the electronic device may provide a control signal to the management logic to change the state of the switch corresponding to the energy storage component to the switch off state, when detecting that the warning state of the energy storage component lasts based on the asserted interrupt.

Each of the switch controllers may continuously monitor the channel current, the channel voltage and the channel temperature of the corresponding channel even when the corresponding switch is in the switch off state, determine the state of the corresponding energy storage component as any one of a normal state, a warning state and a defect state according to the monitoring result, and provide the state information of the energy storage component to the management logic.

The management logic may assert an interrupt for an energy storage component, which corresponds to a switch in the switch off state, to an electronic device when the energy storage component is in the defect state, and the electronic device may provide a warning signal to a user based on the asserted interrupt.

The auxiliary power supply may further include: a nonvolatile memory device suitable for storing state information of the switches coupled to the respective channels when the supply of the external power is removed; and a management logic suitable for obtaining the state information of the switch from the nonvolatile memory device and providing the obtained information to the corresponding switch controller, when the external power is supplied again. Each of the switch controllers may set the switch coupled to the corresponding channel to the switch on state when the external power is supplied, and set the state of the switch based on the state information received from the management logic when the state information is received.

Each of the switch controllers may control the state of the corresponding switch based on a plurality of thresholds for the channel current, the channel voltage and the channel temperature, which correspond thereto, and the auxiliary power supply may further include a management logic suitable for obtaining the plurality of thresholds from an external device or an external resistance value, and providing the plurality of thresholds to the switch controllers.

The switch may be a low-side switch.

The auxiliary power management device implemented based on some embodiments of the disclosed technology can guarantee the reliability of an electronic system by enabling a stable system down even in a case of a sudden power off.

Furthermore, the auxiliary power management device implemented based on some embodiments of the disclosed technology can detect, in real time, various types of defects in an energy storage component which provides auxiliary power when the supply of external power to an electronic device is cut off, and control a current flowing to the energy storage component upon detection of a defect in the energy storage component.

DETAILED DESCRIPTION

Hereafter, various embodiments of the disclosed technology will be described in detail with reference to the accompanying drawings.

Figure 1:
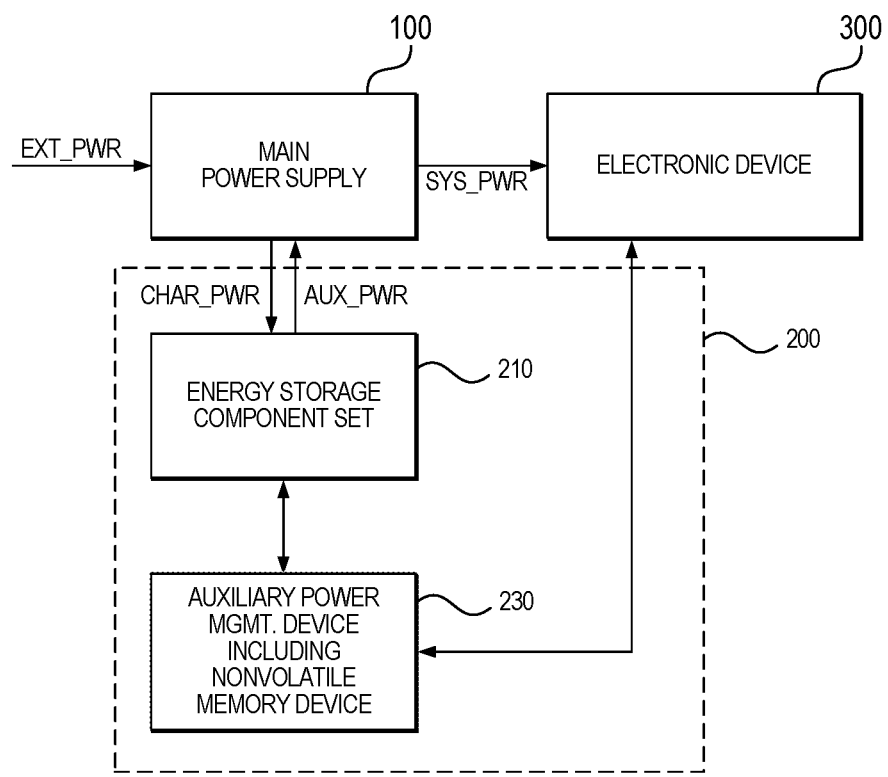
FIG. 1 is a diagram illustrating an example of an electronic system 20 including an auxiliary power supply 200.

FIG. 1 is a diagram illustrating an example of an electronic system 20 including a main power supply 100 and an auxiliary power supply 200.

The electronic system 20 may include an electronic device 300 is coupled to receive electrical power from either the main power supply 100 or auxiliary power supply 200 when the main power supply 100 is not available. In some implementations, the auxiliary power supply 200 may be an alternate source for providing electric power that serves as backup for the primary power source. The main power supply 100 is coupled to receive external power EXT_PWR inputted from an external power source and in turn supplies power to the electronic device 300.

In some implementations, the main power supply 100 may also be used to provide power to the auxiliary power supply 200.

The main power supply 100 may provide the electronic device 300 with electrical power as system power SYS_PWR during a normal operation. In various implementations, the electronic device 300 may include a processor and a memory for controlling overall operations of the electronic system 20. For example, the electronic device 300 may output data stored therein to external devices outside the electronic system 20 by using the system power SYS_PWR and may receive data from the external devices.

In addition to power up the electronic device 300, the main power supply 100 may provide the external power EXT_PWR as a charging power CHAR_PWR to charge the auxiliary power supply 200 during a normal operation in a design using a rechargeable battery pack or energy storage component set 210 as part of the auxiliary power supply 200 and an auxiliary power management device 230 is coupled to the energy storage component set 210 that manages the power in the rechargeable battery pack.

The energy storage component set 210 may include one or more energy storage components or rechargeable batteries. The energy storage component may receive the charging power CHAR_PWR from the main power supply 100 and store the received charging power CHAR_PWR, and supply auxiliary power AUX_PWR to the main power supply 100 upon termination of power supply from the external power EXT_PWR. For example, the energy storage component set 210 may include ultra-capacitors for storing electric energy.

The main power supply 100 may provide the auxiliary power AUX_PWR from the energy storage component set 210 as system power SYS_PWR to the electronic device 300, upon sudden termination of power supply from the external power EXT_PWR.

By using the auxiliary power supply 200, the main power supply 100 may operate based on the power from the auxiliary power supply 200 to stably shut down the electronic system 20 and guarantee the integrity of the electronic system 20, even in the case of a sudden termination of power supply from the external power EXT_PWR.

The energy storage components included in the energy storage component set 210 may have defects. When a defective energy storage component is included in the energy storage component set 210, the auxiliary power supply 200 may not provide sufficient auxiliary power AUX_PWR to the electronic device 300 upon a sudden termination of power supply from the external power EXT_PWR. For example, a certain energy storage component included in the energy storage component set 210 may have a short circuit due to a defect thereof. When a certain energy storage component is shorted, a current may flow through the energy storage component, and almost no current may flow to normal energy storage components coupled in parallel to the energy storage component. When no current flows to the normal energy storage components, the normal energy storage components may not be normally charged.

The electronic system 20 may need to detect a defect as soon as the defect occurs in an energy storage component, and interrupt a current flowing to the defective energy storage component, in order to guarantee the integrity thereof.

In some embodiments of the disclosed technology, the auxiliary power management device 230 may detect, in real time, whether a defect occurs in each of the energy storage components included in the energy storage component set 210, and control a current flowing to the energy storage component depending on whether the defect occurred.

Specifically, the auxiliary power management device 230 may monitor a current, voltage and temperature corresponding to each of the energy storage components, and detect various types of defects in the energy storage component in real time, based on the monitoring result. Furthermore, the auxiliary power management device 230 may control a switch interworking with the energy storage component in which the defect was detected, thereby interrupting the current flowing to the defective energy storage component.

The auxiliary power management device 230 may detect a defect as soon as the defects occurs in an energy storage component, and interrupt a current flowing to the defective energy storage component, thereby securing sufficient auxiliary power as an alternate source for providing electric power that serves as backup upon sudden termination of power supply from the external power EXT_PWR.

Furthermore, since the auxiliary power management device 230 separated from the electronic device 300 detects a defect of an energy storage component in real time, and controls a current flowing to the energy storage component, it is possible to minimize the resource consumption of the electronic device 300, which is required for controlling the energy storage component. Therefore, the overhead of the electronic device 300 may be reduced.

The auxiliary power supply 200 in some embodiments of the disclosed technology will be described in detail with reference to FIGS. 2 to 10.

Figure 2:
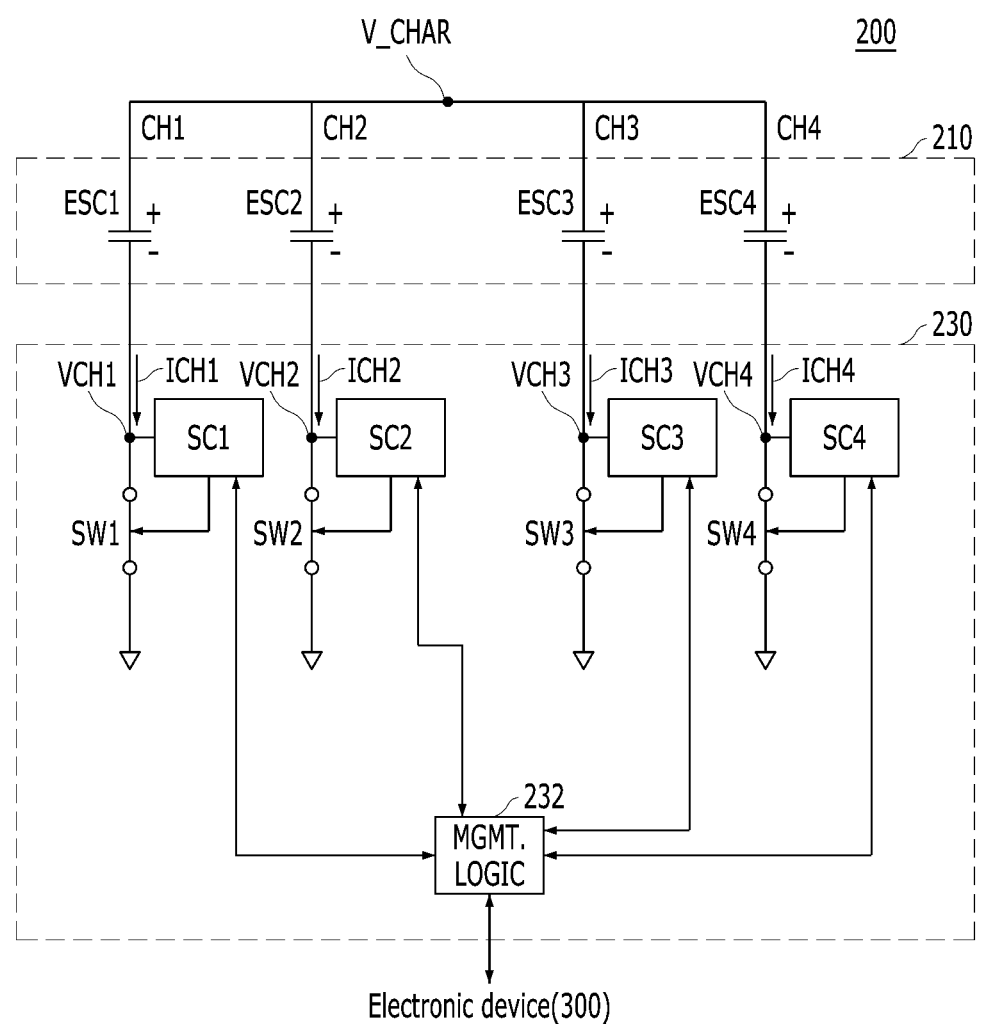
FIG. 2 is a diagram illustrating an example of the auxiliary power supply 200 including an auxiliary power management device 230.

FIG. 2 is a diagram illustrating an example of the auxiliary power supply 200 including the auxiliary power management device 230.

As described with reference to FIG. 1, the auxiliary power supply 200 may include the energy storage component set 210 and the auxiliary power management device 230. The energy storage component set 210 and the auxiliary power management device 230 of FIG. 2 may correspond to those described with reference to FIG. 1.

The energy storage component set 210 may include a plurality of energy storage components ESC1 to ESC4. For example, the plurality of energy storage components ESC1 to ESC4 may be battery cells, polymer tantalum capacitors, MLCCs (Multi-Layer Ceramic Capacitors), electrolytic capacitors or hybrid capacitors. When a charging voltage V_CHAR is applied from the main power supply 100, the plurality of energy storage components ESC1 to ESC4 may be charged.

The energy storage components may have a defect state in which they are not normally charged. The defect state may include an open circuit state in which the energy storage components are not normally charged because elements thereof are open, and a short circuit state in which the energy storage components are not normally charged because the elements thereof have a short circuit.

The auxiliary power management device 230 may include a plurality of switches SW1 to SW4, a plurality of channels CH1 to CH4, a plurality of switch controllers SC1 to SC4 and one or more management logics 232.

The plurality of switches SW1 to SW4 may be coupled to the plurality of energy storage components ESC1 to ESC4 through the channels CH1 to CH4. The plurality of switches SW1 to SW4 may control currents flowing to the corresponding energy storage components. For example, the first switch SW1 may be coupled to the first energy storage component ESC1 through the first channel CH1, and control the current flowing to the first energy storage component ESC1.

In an implementation, the switches SW1 to SW4 may be low-side switches coupled between the corresponding energy storage components and the grounds of the corresponding channels. In some implementations, the low-side switches may include a switch that is connected to the circuit ground.

The currents flowing to the channels CH1 to CH4 may be referred to as channel currents ICH1 to ICH4, and voltages in the switches SW1 to SW4 may be referred to as channel voltages VCH1 to VCH4. The temperatures of the channels CH1 to CH4 may be referred to as channel temperatures. For example, the channel temperatures may be obtained by sensing the temperatures of the switches SW1 to SW4.

The plurality of switches SW1 to SW4 may each have any one state of three kinds of states such as a switch on state, a switch off state and a current-limited state, for example. The switch on state may indicate the state in which the switch has a short circuit, and the switch off state may indicate the state in which the switch has an open circuit. The current-limited state may indicate the state in which the switch has short circuit but has a larger resistance value than in the switch on state. That is, the current-limited state may indicate the state in which a smaller amount of current is controlled to flow through a channel than in the switch on state.

Each of the switch controllers SC1 to SC4 may detect a defect of the corresponding energy storage component, and control the corresponding switch to have any one state of the three kinds of states according to whether the defect of the energy storage component is detected. The switch controllers SC1 to SC4 may each include a sensor for sensing a channel current, a channel voltage and a channel temperature. Each of the switch controllers SC1 to SC4 may detect a defect of the corresponding energy storage component by using the sensor.

The management logic 232 may support interfacing between the switch controllers SC1 to SC4 and the electronic device 300. The management logic 232 may obtain current thresholds, voltage thresholds and temperature thresholds, which are required for detecting defects of the energy storage components ESC1 to ESC4, from the electronic device 300 or a resistor outside the auxiliary power management device 230, and provide the obtained thresholds to the switch controllers SC1 to SC4. When the external resistance value is changed by a user or the thresholds from the electronic device 300 are changed, the thresholds may be changed without a change in internal configuration of the auxiliary power management device 230.

The management logic 232 may obtain, from the switch controllers SC1 to SC4, information on whether the energy storage components have defects.

Furthermore, the management logic 232 may obtain the channel currents ICH1 to ICH4 and the channel voltages VCH1 to VCH4 from the switch controllers SC1 to SC4, and detect the asymmetries or uneven current and/or voltage distribution among the channel currents ICH1 to ICH4 and the channel voltages VCH1 to VCH4, thereby detecting the defects of the energy storage components. For example, the management logic 232 may include a timer (not illustrated). The management logic 232 may detect the defects of the energy storage components ESC1 to ESC4 by using the timer and the channel currents ICH1 to ICH4 and the channel voltages VCH1 to VCH4, which are obtained from the switch controllers SC1 to SC4.

The management logic 232 may provide the electronic device 300 with the information on whether the energy storage components have defects, which was obtained from the switch controllers SC1 to SC4 or determined by the management logic 232. The electronic device 300 may provide a control signal to the management logic 232 based on the information on whether the energy storage components have defects, and the management logic 232 may control the switch controllers SC1 to SC4 to change the states of the switches SW1 to SW4 in response to the control signal.

FIG. 2 illustrates that the auxiliary power management device 230 includes four switch controllers SC1 to SC4 and one management logic 232, but the number of the switch controllers SC1 to SC4 and the management logic 232 is not limited thereto.

Defect detection methods depending on the types of defects of the energy storage components will be described in detail with reference to FIGS. 3A to 3C, 4A to 4C, 5A, 5B, 6A, 6B and 7A to 7C. Hereafter, the case in which a defect of the first energy storage component ESC1 is detected will be taken as an example for describing the defect detection method. Defects of the second to fourth energy storage components ESC2 to ESC4 may also be detected through substantially the same method as the method of detecting a defect of the first energy storage component ESC1.

Figure 3A:
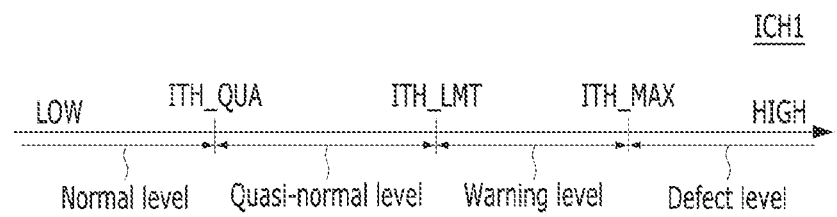
FIGS. 3A to 3C illustrate channel current levels, channel voltage levels and channel temperature levels for detecting various defects of an energy storage component.
Figure 3B:
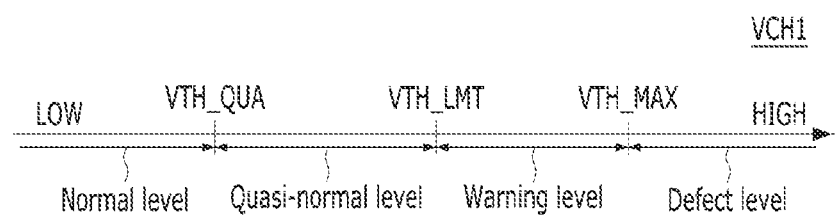
Figure 3C:
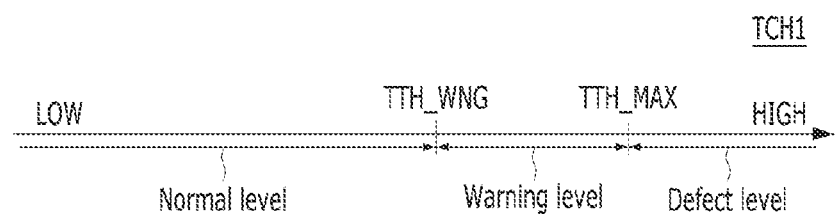

FIGS. 3A to 3C illustrate channel current levels, channel voltage levels and channel temperature levels for detecting various defects of an energy storage component.

Referring to FIG. 3A, a first channel current ICH1 may be classified into a normal level, a quasi-normal level, a warning level and a defect level according to the magnitude thereof. The level of the first channel current ICH1 may be classified as a normal level, a quasi-normal level, a warning level and a defect level based on a quasi-normal current threshold ITH_QUA, a current warning threshold ITH_WNG and a maximum current threshold ITH_MAX. In some implementations, the quasi-normal level can indicate a channel current between the normal level and the warning level that requires a warning. In some implementations, the defect level can indicate that the corresponding energy storage component has a defect.

Referring to FIG. 3B, a first channel voltage VCH1 may be classified into a normal level, a quasi-normal level, a warning level and a defect level according to the magnitude thereof. The level of the first channel voltage VCH1 may be classified by a quasi-normal voltage threshold VTH_QUA, a voltage warning threshold VTH_WNG and a maximum voltage threshold VTH_MAX.

Referring to FIG. 3C, a first channel temperature TCH1 may be classified into a normal level, a warning level and a defect level according to the magnitude thereof. The level of the first channel temperature TCH1 may be classified by a temperature warning threshold TTH_WNG and a maximum temperature threshold TTH_MAX.

The state of the first energy storage component ESC1 may be determined to be a defect state, a warning state or a normal state, depending on the level of the first channel current ICH1, the first channel voltage VCH1 or the first channel temperature TCH1. In some implementations, the warning state can include a state that requires a warning associated with the corresponding energy storage component, and the defect state can indicate that the corresponding energy storage component has a defect.

The defect state may indicate the state in which a defect of the energy storage component is detected based on the channel current, the channel voltage or the channel temperature.

The warning state may indicate the state in which the state of the energy storage component does not correspond to the defect state, but the channel current needs to be limited because the channel current or the channel voltage excessively increased.

The normal state may indicate a state which does not correspond to the defect state or the warning state, or the case in which the energy storage component has no defect or the switch interworking with the energy storage component is normally set to the switch off state, even though the energy storage component has a defect. For example, when the state of an energy storage component is determined as the defect state and thus the state of the switch corresponding to the energy storage component is changed from the switch on state to the switch off state, the channel current, the channel voltage and the channel temperature may decrease to the normal level. When the channel current, the channel voltage and the channel temperature decrease to the normal level, the state of the energy storage component may be determined as the normal state, and a switch controller may not control the switch interworking with the energy storage component.

The first switch controller SC1 may control the first switch SW1 based on the state of the first energy storage component ESC1. When the state of the first energy storage component ESC1 is determined as the defect state or the warning state, the first switch controller SC1 may provide the state information of the first energy storage component ESC1 to the management logic 232.

FIGS. 4A to 4C, 5A, 5B, 6A, 6B and 7A to 7C are graphs for describing methods for detecting various types of defects in an energy storage component using the various thresholds described with reference to FIGS. 3A to 3C.

Figure 4A:
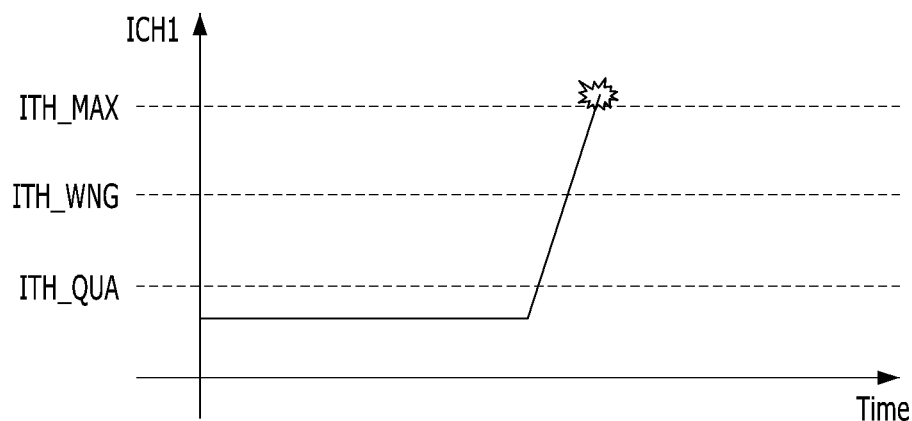
FIGS. 4A to 4C are graphs that show a method for detecting a short circuit in the energy storage component.
Figure 4B:
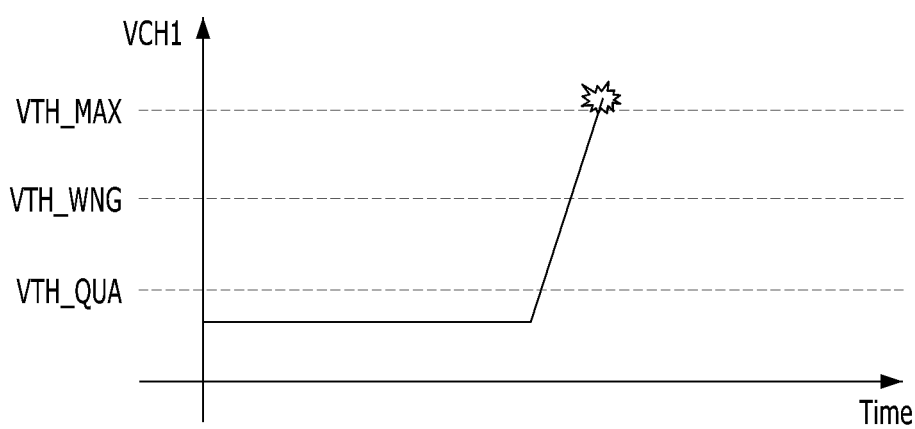
Figure 4C:
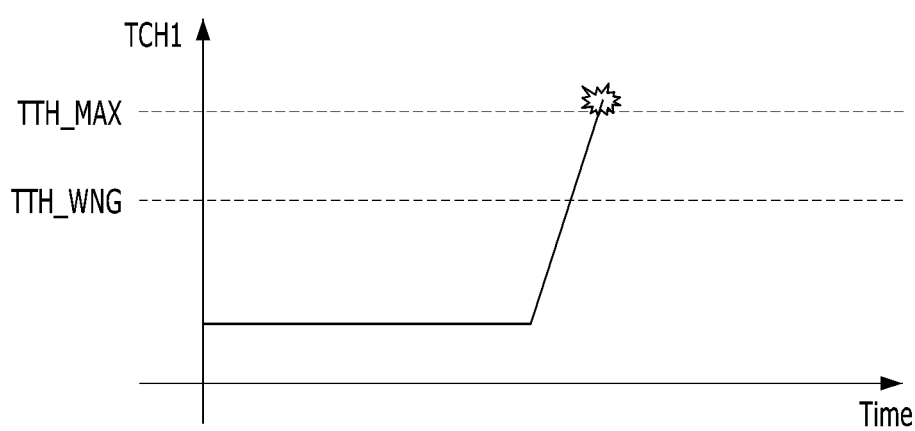

FIGS. 4A to 4C are graphs that show a method for detecting a short circuit in an energy storage component.

The short circuit may include a run-time short circuit state that occurs at the first energy storage component ESC after the first energy storage component ESC1 has left the manufacturer's control. The run-time short circuit state that occurs at the first energy storage component ESC1 may drastically increase the first channel current ICH1 and the first channel voltage VCH1. The increase in the first channel current ICH1 and the first channel voltage VCH1 may result in the increase in the first channel temperature TCH1.

In some embodiments of the disclosed technology, the first switch controller SC1 may effectively detect the run-time short circuit state of the first energy storage component ESC1 by using all of the first channel current ICH1, the first channel voltage VCH1 and the first channel temperature TCH1.

The graph of FIG. 4A indicates the first channel current ICH1 in accordance with time. The maximum current threshold ITH_MAX, the current warning threshold ITH_WNG and the quasi-normal current threshold ITH_QUA, which are a plurality of thresholds associated with the first channel current ICH1, are illustrated on the vertical axis of the graph of FIG. 4A.

The graph of FIG. 4B indicates the first channel voltage VCH1 in accordance with time. The maximum voltage threshold VTH_MAX, the voltage warning threshold VTH_WNG and the quasi-normal voltage threshold VTH_QUA, which are a plurality of threshold values associated with the first channel voltage VCH1, are illustrated on the vertical axis of the graph of FIG. 4B.

The graph of FIG. 4C indicates the first channel temperature TCH1 in accordance with time. The maximum temperature threshold TTH_MAX and the temperature warning threshold TTH_WNG, which are a plurality of threshold values associated with the first channel temperature TCH1, are illustrated on the vertical axis of the graph of FIG. 4C.

The first switch controller SC1 may detect the first channel current ICH1, the first channel voltage VCH1 and the first channel temperature TCH1 in real time by using a sensor. When the first channel current ICH1 exceeds the maximum current threshold ITH_MAX, the first channel voltage VCH1 exceeds the maximum voltage threshold VTH_MAX, or the first channel temperature THC1 exceeds the maximum temperature threshold TTH_MAX, the first switch controller SC1 may determine that the first energy storage component ESC1 is in the run-time short circuit state.

For example, as the first energy storage component ESC1 is shorted during the operation of the electronic system 20, the first channel current ICH1 and the first channel voltage VCH1 rapidly increase, but may not exceed predetermined thresholds. When the state of the first energy storage component ESC1 stays at the run-time short circuit state, the first channel temperature TCH1 may continuously increase even though the first channel current ICH1 and the first channel voltage VCH1 do not exceed the predetermined thresholds. Although the first switch controller SC1 does not detect the run-time short circuit state of the first energy storage component ESC1 based on the first channel current ICH1 and the first channel voltage VCH1, the first switch controller SC1 may detect the run-time short circuit state based on the first channel temperature TCH1.

When determining that the first energy storage component ESC1 is in the run-time short circuit state in the case that the first switch SW1 is in the switch on state, the first switch controller SC1 may change the state of the first switch SW1 to the switch off state. The first switch controller SC1 may provide the state information of the first energy storage component ESC1 to the management logic 232.

Figure 5A:
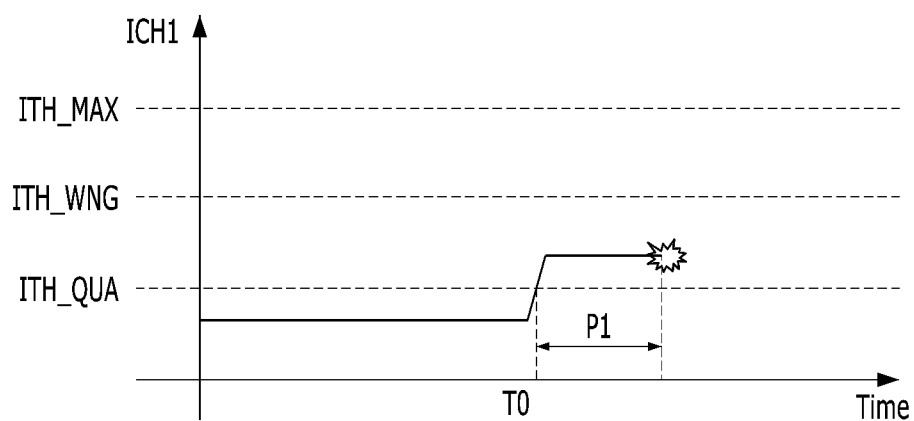
FIGS. 5A and 5B are graphs that show a method for detecting a short circuit in the energy storage component at an initial stage.
Figure 5B:
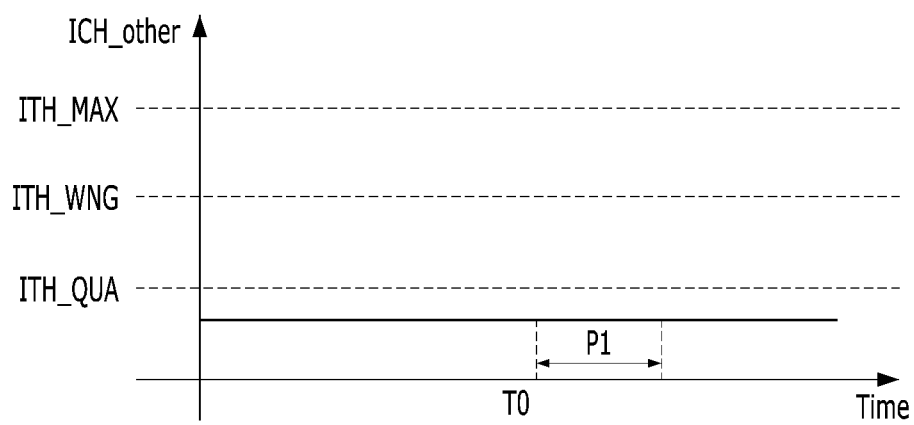

FIGS. 5A and 5B are graphs that show a method for detecting a short circuit in the first energy storage component ESC1 at an initial stage.

The initial short circuit state indicates a short circuit the first energy storage component ESC1 originally has. When power is supplied to the energy storage component set 210 in the case that an energy storage component in the initial short circuit state is included in the energy storage component set 210, a larger amount of current may flow to the energy storage component in the initial short circuit state than the other energy storage components. For example, a current exceeding the quasi-normal current threshold ITH_QUA may flow to the energy storage component in the initial short circuit state.

The channel currents ICH1 to ICH4 may increase due to external factors, regardless of whether the energy storage components ESC1 to ESC4 have defects. For example, when power is supplied to the energy storage component set 210 as the electronic system 20 is booted, the channel currents ICH1 to ICH4 may temporarily exceed the quasi-normal current threshold ITH_QUA. Therefore, when the first switch controller SC1 determines that the first energy storage component ESC1 is in the initial short circuit state, based on only information on whether the first channel current ICH1 exceeds the quasi-normal current threshold ITH_QUA, and changes the state of the first switch SW1 to the switch off state, the energy storage components in the normal state may become unavailable, and thus the quantity of charges in the energy storage component set 210 may decrease.

When more than a predetermined number of channel currents among the channel currents ICH1 to ICH4 exceed the quasi-normal current threshold ITH_QUA, the management logic 232 may determine that the channel currents ICH1 to ICH4 increased due to external factors, and not determine that the energy storage components are in the initial short circuit state.

On the other hand, the management logic 232 may detect whether the state in which only a predetermined number of channel currents or less than a predetermined number of channel currents among the channel currents ICH1 to ICH4 are equal to or more than the quasi-normal current threshold ITH_QUA lasts for a predetermined time or more, in order to detect whether the energy storage components are in the initial short circuit state.

FIG. 5A illustrates the first channel current ICH1 in accordance with time, and FIG. 5B illustrates the other channel currents ICH_other in accordance with time. The other channel currents ICH_other may indicate the second to fourth channel currents ICH2 to ICH4. The maximum current threshold ITH_MAX, the current warning threshold ITH_WNG and the quasi-normal current threshold ITH_QUA are illustrated on the vertical axes of the graphs of FIGS. 5A and 5B.

The management logic 232 may obtain the levels of the channel currents ICH1 to ICH4 from the switch controllers SC1 to SC4 in real time. The management logic 232 may detect the initial short circuit state of the first energy storage component ESC1 by detecting asymmetries or uneven current and/or voltage distribution among the channel currents ICH1 to ICH4 based on the levels of the channel currents ICH1 to ICH4.

For example, when detecting that the first channel current ICH1 exceeds the quasi-normal current threshold ITH_QUA, the management logic 232 may operate the timer. When the state in which the first channel current ICH1 exceeds the quasi-normal current threshold ITH_QUA and the other channel currents ICH_other are equal to or less than the quasi-normal current threshold ITH_QUA is retained during a first time period P1 after the timer is triggered, the management logic 232 may determine that the first energy storage component ESC1 is in the initial short circuit state.

When determining that the first energy storage component ESC1 is in the initial short circuit state, the management logic 232 may provide the first switch controller SC1 with information indicating that the first energy storage component ESC1 has a defect. When the first switch SW1 is in the switch on state, the first switch controller SC1 may change the state of the first switch SW1 to the switch off state based on the information indicating that the first energy storage component ESC1 has a defect.

Figure 6A:
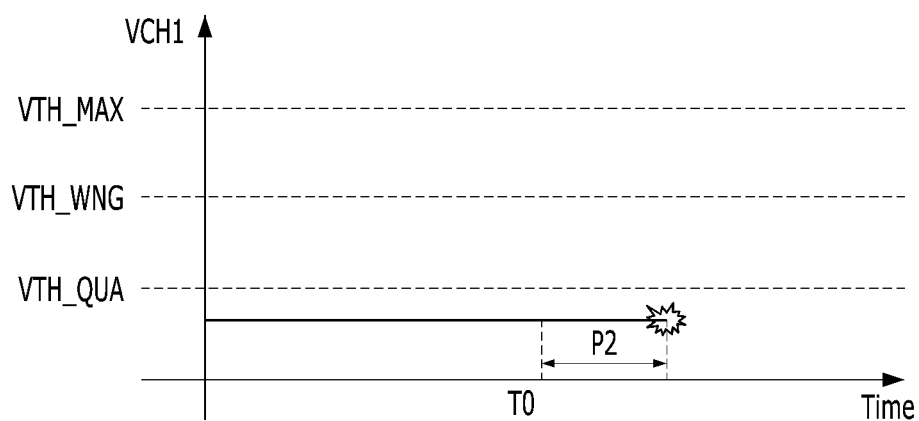
FIGS. 6A and 6B are graphs that show a method for detecting an open circuit in the energy storage component.
Figure 6B:
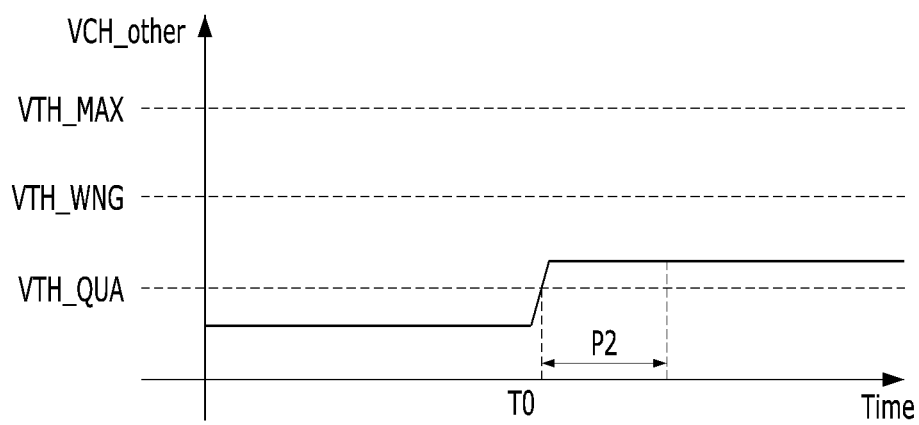

FIGS. 6A and 6B are graphs that show a method for detecting an open circuit in the first energy storage component ESC1.

When an energy storage component that has an open circuit is included in the energy storage component set 210, a current may not smoothly flow to the energy storage component in the open circuit state. On the other hand, when the energy storage component in the open circuit state is included in the energy storage component set 210, a larger amount of current may flow to the energy storage components having no defects than in the case that all of the energy storage components have no defects.

The channel voltage may be determined based on the channel current and the resistance of the switch included in the corresponding channel. Therefore, when an energy storage component in the open circuit state is included in the energy storage component set 210, the channel voltage of a channel in the open circuit state may be lower than that of a channel in the normal state. On the other hand, the channel voltage of the channel in the normal state may become slightly higher than in the case that all of the energy storage components ESC1 to ESC4 have no defects.

The management logic 232 may detect whether the state in which only a predetermined number of channel voltages or less than a predetermined number of channel voltages among the channel voltages VCH1 to VCH4 are less than the quasi-normal voltage threshold VTH_QUA lasts for a predetermined time or more, in order to detect whether the energy storage components are in the open circuit state.

FIG. 6A illustrates the first channel voltage VCH1 in accordance with time, and FIG. 6B illustrates the other channel voltages VCH_other in accordance with time. The other channel voltages VCH_other may indicate the second to fourth channel voltages VCH2 to VCH4. The maximum voltage threshold VTH_MAX, the voltage warning threshold VTH_WNG and the quasi-normal voltage threshold VTH_QUA, which are associated with the first channel voltage VCH1, are illustrated on the vertical axes of the graphs of FIGS. 6A and 6B.

The management logic 232 may obtain the levels of the channel voltages VCH1 to VCH4 from the switch controllers SC1 to SC4 in real time. When the state in which a predetermined number of channel voltages or more than a predetermined number of channel voltages among the channel voltages VCH1 to VCH4 exceed the quasi-normal voltage threshold VTH_QUA and the other channel voltages are equal to or less than the quasi-normal voltage threshold VTH_QUA lasts during a second time period P2 or more, the management logic 232 may determine that an energy storage component coupled to a channel whose channel voltage is equal to or less than the quasi-normal voltage threshold VTH_QUA is in the open circuit state.

For example, when three channel voltages, for example, the other channel voltages VCH_other exceed the quasi-normal voltage threshold VTH_QUA, the management logic 232 may operate the timer. When the state in which the other channel voltages VCH_other exceed the quasi-normal voltage threshold VTH_QUA and the first channel voltage VCH1 is equal to or less than the quasi-normal voltage threshold VTH_QUA lasts during the second time period P2 or more after the timer is triggered, the management logic 232 may determine that the first energy storage component ESC1 is in the open circuit state.

The management logic 232 may provide the first switch controller SC1 with information indicating that the first energy storage component ESC1 has a defect. When the first switch SW1 is in the switch on state, the first switch controller SC1 may change the state of the first switch SW1 to the switch off state based on the information indicating that the first energy storage component ESC1 has a defect.

Figure 7A:
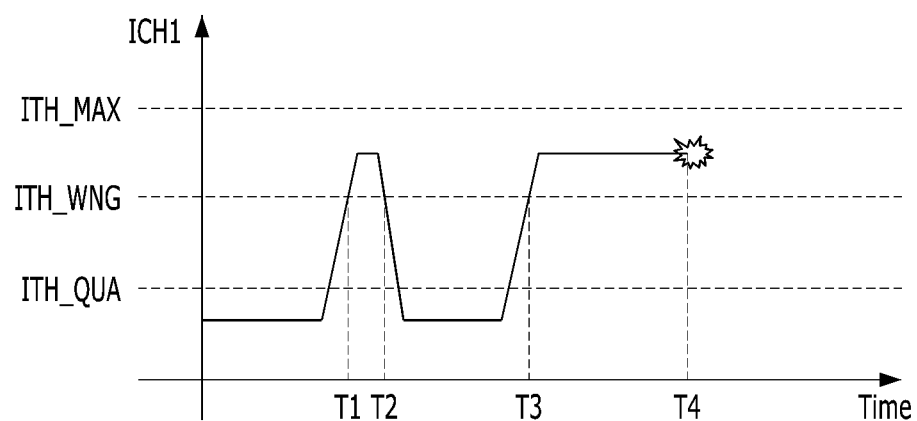
FIGS. 7A to 7C are graphs that show a method for detecting a warning associated with the energy storage component.
Figure 7B:
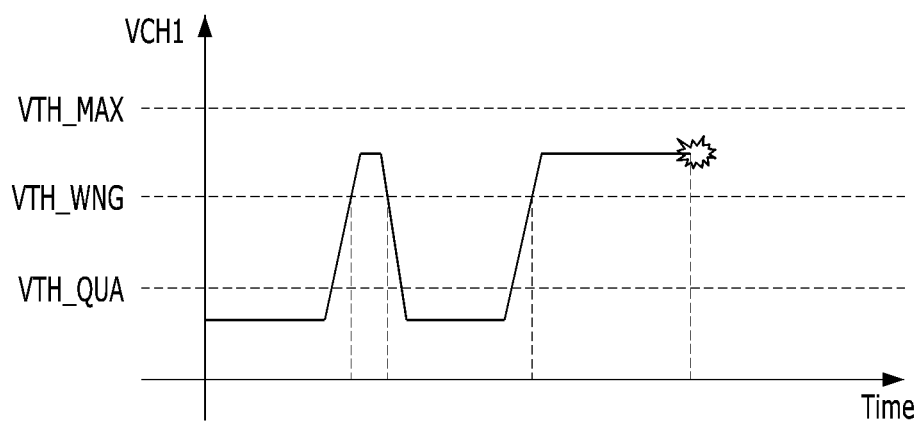
Figure 7C:
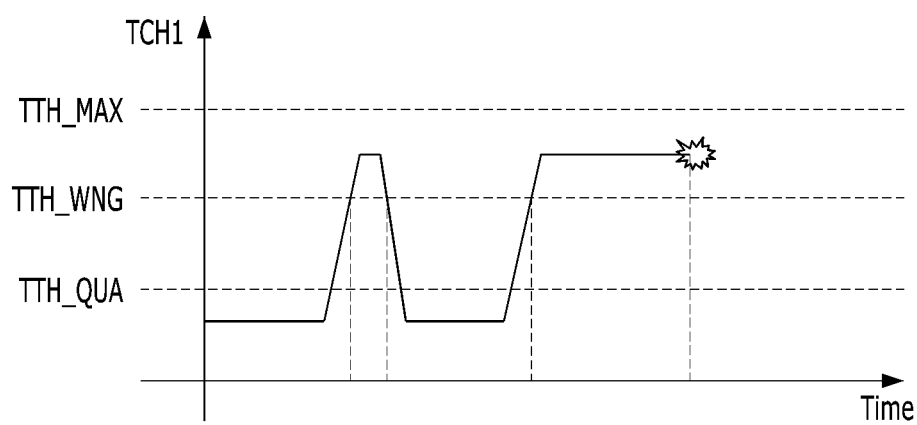

FIGS. 7A to 7C are graphs that show a method for detecting a warning associated with an energy storage component.

When detecting the warning state of the first energy storage component ESC1 based on the first channel voltage VCH1, the first channel current ICH1 and the first channel temperature TCH1, the first switch controller SC1 may change the state of the first switch SW1 to the current-limited state.

When the first channel current ICH1 exceeds the current warning threshold ITH_WNG, the first channel voltage VCH1 exceeds the voltage warning threshold VTH_WNG, or the first channel temperature THC1 exceeds the temperature warning threshold TTH_WNG, the first switch controller SC1 may detect the warning state of the first energy storage component ESC1. When detecting the warning state of the first energy storage component ESC1, the first switch controller SC1 may provide the state information of the first energy storage component ESC1 to the management logic 232. Furthermore, when the first switch SW1 is in the switch on state and the first energy storage component ESC1 is in the warning state, the first switch controller SC1 may change the state of the first switch SW1 to the current-limited state.

FIG. 7A illustrates the first channel current ICH1 in accordance with time. The maximum current threshold ITH_MAX, the current warning threshold ITH_WNG and the quasi-normal current threshold ITH_QUA are illustrated on the vertical axis of the graph of FIG. 7A.

In the example of FIG. 7A, the first channel current ICH1 may exceed the current warning threshold ITH_WNG at a first time point T1. When detecting that the first channel current ICH1 is equal to or more than the current warning threshold ITH_WNG, the first switch controller SC1 may detect the warning state of the first energy storage component ESC1, and change the state of the first switch SW1 to the current-limited state. The first switch controller SC1 may provide an interrupt signal to a memory controller 130 through the management logic 232, the interrupt signal informing the memory controller 130 of the warning state of the first energy storage component ESC1.

The case in which the first energy storage component ESC1 is determined to be in the warning state may include the case in which the first energy storage component ESC1 has no defects, but the first channel current ICH1 temporarily increases due to an external factor. When the first energy storage component ESC1 has no defects, the first channel current ICH1 may be successfully limited by the first switch SW1.

When the first channel current ICH1 decreases to the current warning threshold ITH_WNG or less in the case that the first switch SW1 is in the current-limited state, the first switch controller SC1 may determine that the first energy storage component ESC1 is in the normal state, and change the state of the first switch SW1 to the switch on state. For example, the first switch controller SC1 may change the state of the first switch SW1 to the switch on state at a second time point T2.

At a third time point T3, the first channel current ICH1 may exceed the current warning threshold ITH_WNG again. The first switch controller SC1 may detect the warning state of the first energy storage component ESC1, and change the state of the first switch SW1 to the current-limited state.

The case in which the first energy storage component ESC1 is determined to be in the warning state may further include the case in which the first energy storage component ESC1 is likely to deteriorate into the defect state. When the first energy storage component ESC1 deteriorates, the first channel current ICH1 may not be successfully limited by the first switch SW1 but retained at the current warning threshold ITH_WNG or more.

At a fourth time point T4, the first switch controller SC1 may change the state of the first switch SW1 to the switch off state when the first energy storage component ESC1 is determined to be in the defect state. In a first example, when the detection result of the channel current, the channel voltage and the channel temperature by the first switch controller SC1 indicates that the first energy storage component ESC1 is in the defect state, the state of the first switch SW1 may be changed to the switch off state. In a second example, when the state of the first energy storage component ESC1 is changed to the defect state under control of the memory controller 130, the state of the first switch SW1 may be changed to the switch off state.

FIG. 7B illustrates the first channel voltage VCH1 in accordance with time. The maximum voltage threshold VTH_MAX, the voltage warning threshold VTH_WNG and the quasi-normal voltage threshold VTH_QUA are illustrated on the vertical axis of the graph of FIG. 7B.

In the example of FIG. 7B, when the first channel voltage VCH1 exceeds the voltage warning threshold VTH_WNG, the first switch controller SC1 may change the state of the first energy storage component ESC1 to the warning state, and change the state of the first switch SW1 to the current-limited state, in a similar manner to the example described with reference to FIG. 7A.

FIG. 7C illustrates the first channel temperature TCH1 in accordance with time. The maximum temperature threshold TTH_MAX and the temperature warning threshold TTH_WNG are illustrated on the vertical axis of the graph of FIG. 7C.

In the example of FIG. 7C, when the first channel temperature TCH1 exceeds the temperature warning threshold TTH_WNG, the first switch controller SC1 may change the state of the first energy storage component ESC1 to the warning state, and change the state of the first switch SW1 to the current-limited state, in a similar manner to the example described with reference to FIG. 7A.

Figure 8:
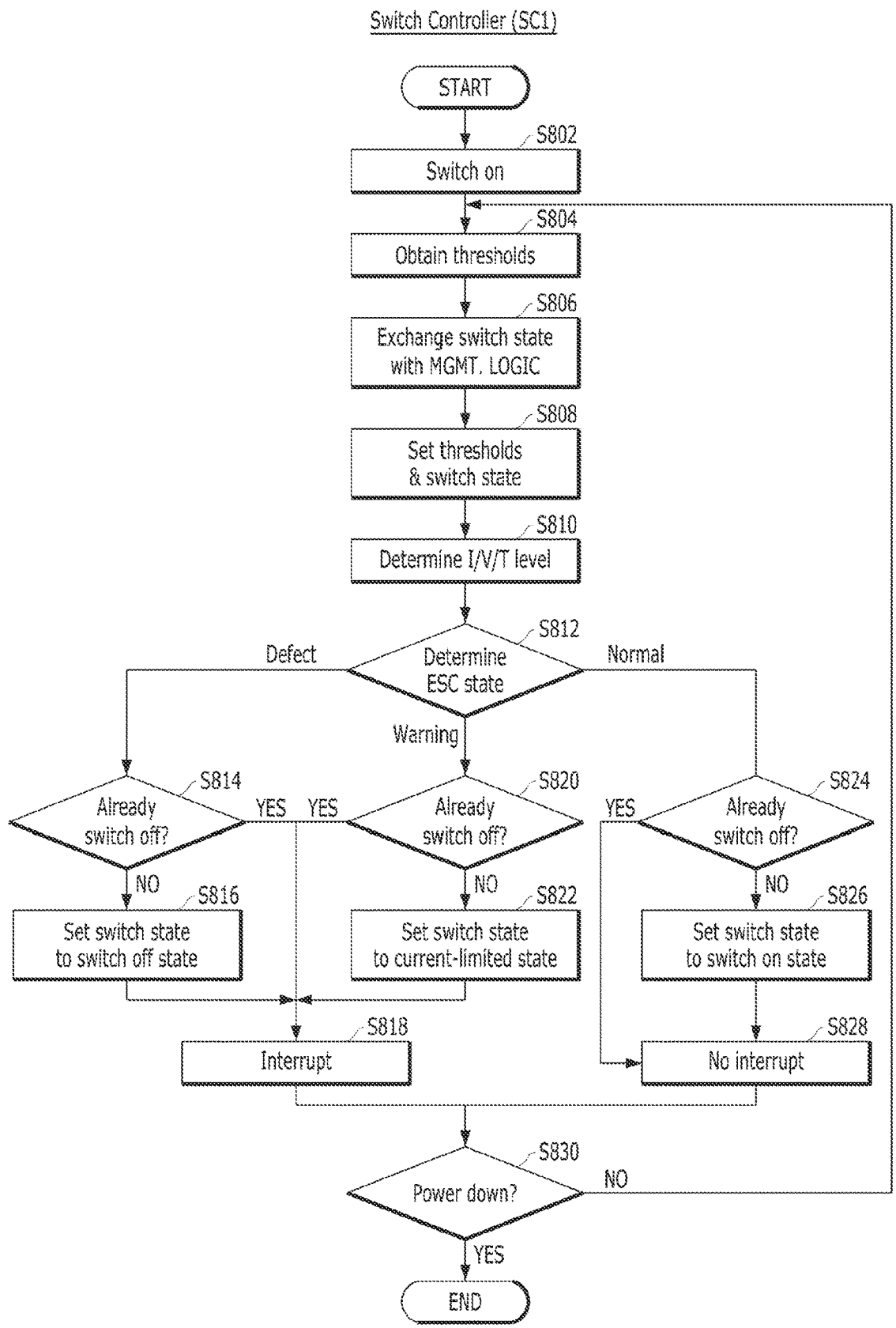
FIG. 8 is a flowchart illustrating an operation of a switch controller based on an embodiment of the disclosed technology.
Figure 9:
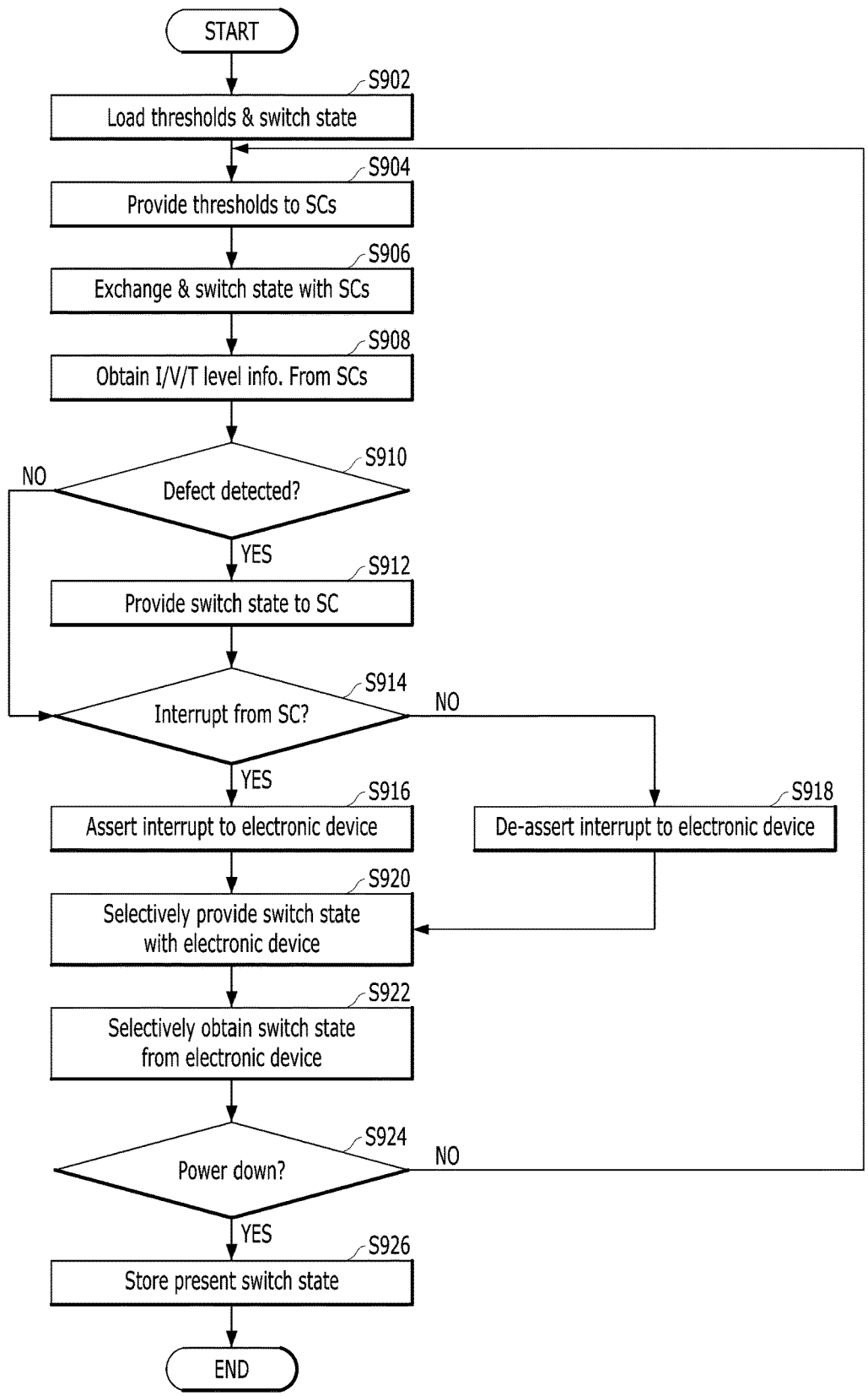
FIG. 9 illustrates an operation of a management logic 232 based on an embodiment of the disclosed technology.
Figure 10:
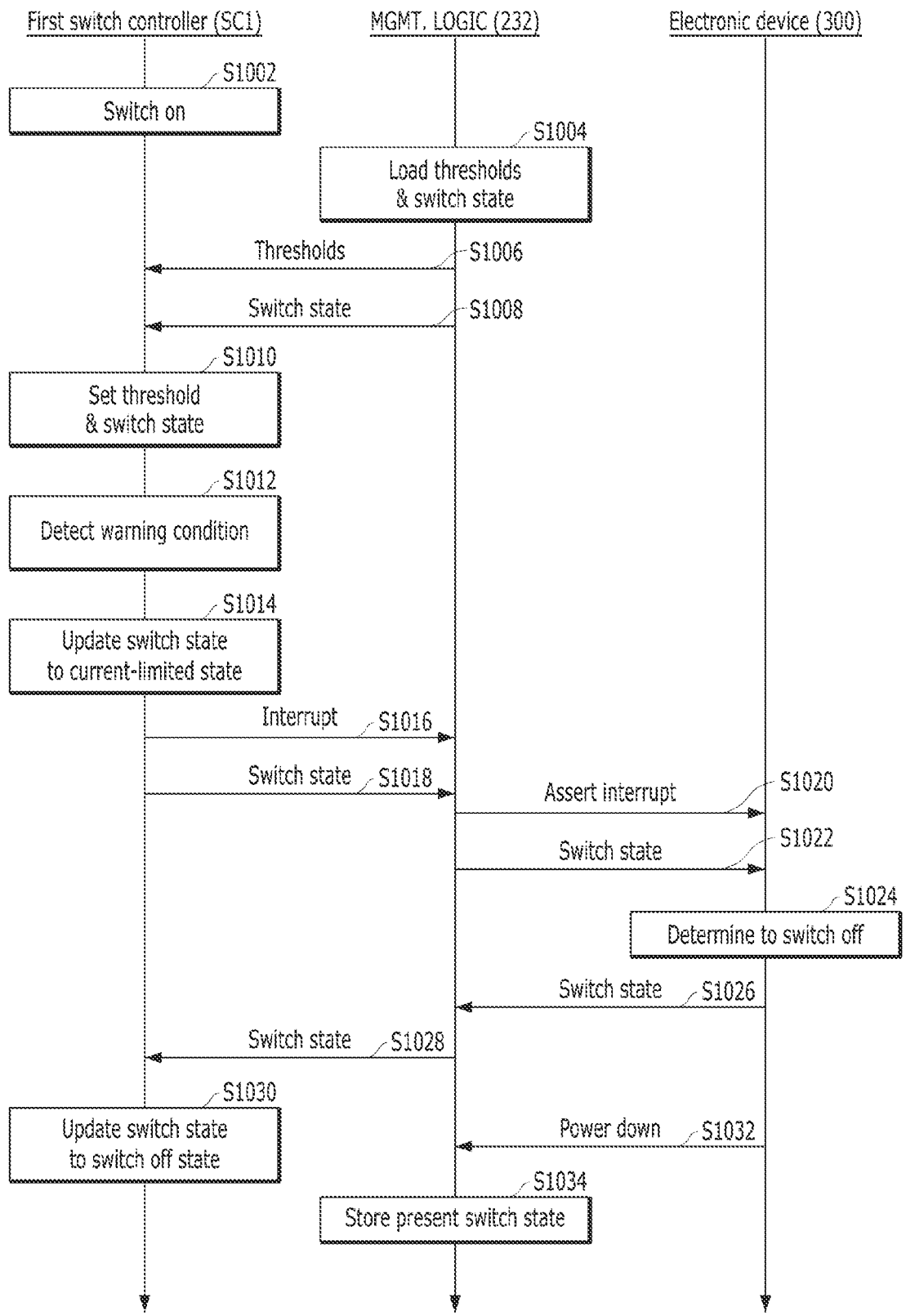
FIG. 10 illustrates an operation of the electronic system 20 based on an embodiment of the disclosed technology.

FIGS. 8 to 10 illustrate the operation of the electronic system 20 to which the methods for detecting a defect of an energy storage component, described with reference to FIGS. 4A to 4C, 5A, 5B, 6A, 6B and 7A to 7C, are applied.

FIG. 8 is a flowchart illustrating an operation of a switch controller based on an embodiment of the disclosed technology.

In FIG. 8, the operation of the first switch controller SC1 will be described as an example. The second to fourth switch controllers SC2 to SC4 may also perform substantially the same operation as the first switch controller SC1.

When power is supplied to the auxiliary power supply 200 from the main power supply 100, the first switch controller SC1 may be set the first switch SW1 to the switch on state at S802.

When the first switch SW1 is set to the switch on state by default, the first energy storage component ESC1 may be charged even during a booting operation of the electronic system 20. Therefore, it is possible to guarantee a stable system shut-down even though the power supply is suddenly cut off during the booting operation of the electronic system 20. The first switch controller SC1 may repeatedly perform an operation of steps S804 to S830 until the power of the electronic system 20 is removed. That is, the operation of steps S804 to S830 may be performed in real time while the electronic system 20 normally operates.

The operation of steps S804 to S830 may include an operation in which the first switch controller SC1 exchanges the state information of the first switch SW1 with the management logic 232, determines the state of the first energy storage component ESC1 based on the first channel current ICH1, the first channel voltage VCH1 and the first channel temperature TCH1, controls the first switch SW1 based on the state of the first energy storage component ESC1, and provides the state information of the first energy storage component ESC1 to the management logic 232. Hereafter, the operation of steps S804 to S830 will be described in detail.

At S804, the first switch controller SC1 may obtain the plurality of thresholds of the channel current, the channel voltage and the channel temperature from the management logic 232.

For example, the first switch controller SC1 may obtain the plurality of thresholds from the management logic 232 in order to set the plurality of thresholds. In a first example, the plurality of thresholds may be inputted to the management logic 232 through a resistor outside the auxiliary power management device 230. When the resistance value of the resistor is changed by a user, the plurality of thresholds may be changed. In a second example, the management logic 232 may acquire the plurality of thresholds from the electronic device 300.

At S806, the first switch controller SC1 may exchange the state information of the first switch SW1 with the management logic 232. As the first switch controller SC1 provides the state of the first switch SW1 to the management logic 232 in real time, the management logic 232 may obtain the current state of the first switch SW1 in real time. Similarly, the management logic 232 may also obtain the current states of the second to fourth switches SW2 to SW4 from the second to fourth switch controllers SC2 to SC4 in real time.

When determining that the state of the first switch SW1 needs to be changed, the management logic 232 may provide, in real time, the first switch controller SC1 with the state information to be changed.

For example, when the electronic system 20 is booted, the first switch controller SC1 may obtain, from the management logic 232, the state information of the first switch SW1 when the electronic system 20 was lastly powered down. The auxiliary power management device 230 may include a nonvolatile memory device for storing the state information of the switches SW1 to SW4 when the electronic system 20 is powered down. The first switch controller SC1 may obtain the state information of the first switch SW1, stored in the nonvolatile memory device, from the management logic 232, and set the state of the first switch SW1 based on the state information. For example, when the defect state of the first energy storage component ESC1 is detected and the state of the first switch SW is changed to the switch off state, before the electronic system 20 is powered down, the management logic 232 may store information in the nonvolatile memory device when the electronic system 20 is powered down, the information indicating that the first switch SW1 is in the switch off state.

Even after the electronic system 20 is powered down, the first energy storage component ESC1 may be retained in the defect state. When power is supplied to the auxiliary power supply 200 after the electronic system 20 is powered down, the first switch controller SC1 may obtain information indicating that the first switch SW1 is in the switch off state. The first switch controller SC1 may not detect the defect state of the first energy storage component ESC1 again, but change the state of the first switch SW1 to the switch off state based on the state information. Therefore, as a current flowing to the first energy storage component ESC1 in the defect state is rapidly interrupted after power is supplied to the auxiliary power supply 200, the other energy storage components may be normally charged. At S810, the first switch controller SC1 may determine the levels of the first channel current ICH1, the first channel voltage VCH1 and the first channel temperature TCH1.

For example, the first switch controller SC1 may determine the levels of the first channel current ICH1, the first channel voltage VCH1 and the first channel temperature TCH1, which are detected in real time, by comparing the first channel current ICH1, the first channel voltage VCH1 and the first channel temperature TCH1 to the plurality of set thresholds.

At S812, the first switch controller SC1 may determine the state of the first energy storage component ESC1 as any one of the normal state, the warning state and the defect state.

For example, the first switch controller SC1 may detect the state of the first energy storage component ESC1 as the run-time short circuit state or the warning state, based on the levels of the first channel current ICH1, the first channel voltage VCH1 and the first channel temperature TCH1.

The management logic 232 may detect the initial short circuit state or the open circuit state based on the channel current and channel voltage information, which are received from the switch controllers SC1 to SC4 in real time, and provide the detected state information to the first switch controller SC1. The first switch controller SC1 may determine the state of the first energy storage component ESC1 as the defect state, according to the state information received from the management logic 232.

When determining that the first energy storage component ESC1 is in the defect state ("Defect" at S812), the first switch controller SC1 may determine whether the first switch SW1 is already in the switch off state, at S814.

When the first switch SW1 is not in the switch off state ("NO" at S814), the first switch controller SC1 may set the first switch SW to the switch off state at S816. The first switch controller SC1 may provide an interrupt signal to the management logic 232 at S818. The management logic 232 may obtain information from the first switch controller SC1 in response to the interrupt signal, the information indicating that the first switch SW1 is in the switch off state.

When the first switch SW1 is in the switch off state ("YES" at S814), the first switch controller SC1 may provide an interrupt signal to the management logic 232 at S818. When it is determined that the first energy storage component ESC1 is in the defect state while the first switch SW1 is already in the switch off state, it may indicate that a large amount of power is leaking through the first switch SW1 even though the state of the first switch SW1 was changed to the switch off state.

The management logic 232 may provide an interrupt signal to the electronic device 300 in response to the interrupt signal. As described with reference to step S806, the management logic 232 may obtain the current state information of the first switch SW1 in real time. The electronic device 300 may obtain the current state information of the first switch SW1 from the management logic 232 in response to the interrupt signal, and provide a control signal to the management logic 232 based on the obtained state information. The operation between the electronic device 300 and the management logic 232 will be described in detail with reference to FIG. 9.

When determining that the first energy storage component ESC1 is in the warning state ("Warning" at S812), the first switch controller SC1 may determine whether the first switch SW1 is already in the switch off state, at S820.

When the first switch SW1 is not in the switch off state ("NO" at S820), the first switch controller SC1 may set the first switch SW to the current-limited state at S822. The first switch controller SC1 may provide an interrupt signal to the management logic 232 at S818.

When the first switch SW1 is in the switch off state ("YES" at S820), the first switch controller SC1 may provide an interrupt signal to the management logic 232 at S818. Similarly to the case in which the first energy storage component ESC1 is determined to be in the defect state while the first switch SW1 is already in the switch off state, the management logic 232 may obtain information from the first switch controller SC1 in response to the interrupt signal, the information indicating that power is leaking through the first switch SW1.

When determining that the first energy storage component ESC1 is in the normal state ("Normal" at S812), the first switch controller SC1 may determine whether the first switch SW1 is already in the switch off state, at S824.

When the first switch SW1 is not in the switch off state ("NO" at S824), the first switch controller SC1 may set the first switch SW1 to the switch on state at S826. For example, the first switch controller SC1 may retain the switch on state when the first switch SW1 was in the switch on state, and change the state of the first switch SW1 to the switch on state when the first switch SW1 was in the current-limited state. Referring to step S828, the first switch controller SC1 may not provide an interrupt signal to the management logic 232 when the first energy storage component ESC1 is in the normal state.

When the first switch SW1 is in the switch off state ("YES" at S824), it may indicate the case in which power leaking through the first energy storage component ESC1 is normally controlled after the state of the first switch SW1 is changed to the switch off state because a defect occurred in the first energy storage component ESC1. Thus, the first switch controller SC1 may not provide an interrupt signal to the management logic 232 at S828.

At S830, the first switch controller SC1 may determine whether the electronic system 20 was powered down.

When a power down of the electronic system 20 is not detected ("NO" at S830), the first switch controller SC1 may repeatedly perform the operation of steps S804 to S830.

When a power down of the electronic system 20 is detected ("YES" at S830), the first switch controller SC1 may end the operation of steps S804 to S830.

FIG. 9 illustrates an operation of the management logic 232 based on an embodiment of the disclosed technology.

When power is supplied to the auxiliary power supply 200 from the main power supply 100, the management logic 232 may load the plurality of thresholds of the channel current, the channel voltage and the channel temperature from the electronic device 300 or a resistor outside the auxiliary power management device 230 at S902. The management logic 232 may load the state information of the switches SW1 to SW4 from a nonvolatile memory device included in the auxiliary power management device 230. The nonvolatile memory device has been described in detail at S806.

After providing the plurality of thresholds and the state information of the switches SW1 to SW4 to the switch controllers SC1 to SC4, the management logic 232 may repeatedly perform an operation of steps S904 to S926 until the electronic system 20 is powered down. That is, the operation of steps S904 to S926 may be performed in real time while the electronic system 20 normally operates. The operation of steps S904 to S926 may include an operation in which the management logic 232 and the switch controllers SC1 to SC4 exchange the state information of the switches SW1 to SW4, an operation in which the management logic 232 detects defects of the energy storage components ESC1 to ESC4, an operation in which the management logic 232 transfers the defect information to the electronic device 300 in response to an interrupt signal from the switch controllers SC1 to SC4, and an operation in which the management logic 232 provides the switch controllers SC1 to SC4 with defect information changed by control of the electronic device 300. The operation of steps S904 to S926 will be described below in detail.

At S904, the management logic 232 may provide the loaded thresholds to the switch controllers SC1 to SC4.

At S906, the management logic 232 may exchange the state information of the switches SW1 to SW4 with the switch controllers SC1 to SC4. The operation of step S906 has been described at S806 in which the management logic 232 exchanges the state information of the first switch SW1 with the first switch controller SC1.

At S908, the management logic 232 may obtain the level information of the channel currents, the channel voltages and the channel temperatures of the channels CH1 to CH4 from the switch controllers SC1 to SC4.

At S910, the management logic 232 may detect the initial short circuit state and the open circuit state among the defect states of the energy storage components ESC1 to ESC4, based on the obtained level information on the channel currents, the channel voltages and the channel temperatures of the channels CH1 to CH4.

When the defect state of an energy storage component is detected ("YES" at S910), the management logic 232 may provide the defect state information of the energy storage component to the switch controller associated with the energy storage component at S912, and then perform step S914. The switch controller may control the switch corresponding to the energy storage component based on the defect state information.

When the defect state of the energy storage component is not detected ("NO" at S910), the management logic 232 may perform step S914.

At S914, the management logic 232 may determine whether an interrupt signal is provided from the switch controllers SC1 to SC4.

When an interrupt signal is provided from a switch controller ("YES" at S914), the management logic 232 may "assert" an interrupt signal to the electronic device 300 in order to inform the electronic device 300 that the energy storage component is in the defect state or the warning state, at S916, and then perform step S920. In some implementations, the assertion of an interrupt signal may be used to transition into a certain state such as an interrupt state.

When no interrupt signals are provided from the switch controllers SC1 to SC4 ("NO" at S914), the energy storage components ESC1 to ESC4 may be all in the normal state. Therefore, the management logic 232 may "de-assert" the interrupt signal at S918, and then perform step S920. In some implementations, the de-assertion of an interrupt signal may be used to transition from the certain state such as the interrupt state to another state.

At S920, the management logic 232 may selectively provide the current state information of the switches SW1 to SW4 to the electronic device 300.

For example, the electronic device 300 may request the current state information of the switch associated with the energy storage component in the defect state or the warning state in response to the interrupt signal of step S916. The management logic 232 may provide the current state information of the switch in response to the request of the electronic device 300.

On the other hand, when de-asserting the interrupt signal as described with reference to step S918, the management logic 232 may not provide the current state information of the switches SW1 to SW4 to the electronic device 300. As long as an interrupt signal is not asserted by the management logic 232, the electronic device 300 may not monitor the current state information of the switches SW1 to SW4. Therefore, the overhead of the electronic device 300 may decrease.

At S922, the management logic 232 may selectively obtain the state information of the switches SW1 to SW4 from the electronic device 300.

Specifically, when it is determined that the state of the switch needs to be changed, the electronic device 300 may provide the management logic 232 with the state information of the switch, which is to be changed.

For example, when detecting that the warning state of a certain energy storage component lasts, the electronic device 300 may provide the management logic 232 with the state information to be changed, in order to change the state of the switch corresponding to the energy storage component to the switch off state.

When the warning state or defect state of the energy storage component is detected even though the switch corresponding to the energy storage component is in the switch off state, the electronic device 300 may determine that sufficient power is unlikely to be received from the auxiliary power supply 200 when the electronic system 20 is suddenly powered down. Therefore, the electronic device 300 may provide a warning signal to a user, such that the user can end an operation which is being performed or back up data for the operation to another electric device.

At S924, the management logic 232 may determine whether the electronic system 20 was powered down.

When a power down of the electronic system 20 is not detected ("NO" at S924), the management logic 232 may repeatedly perform the operation of steps S904 to S924.

When the management logic 232 performs step S912, step S916 or step S922, the state of any one of the switches SW1 to SW4 may be changed. Therefore, when a power down of the electronic system 20 is detected ("YES" at S924), the management logic 232 may store the current states of the switches SW1 to SW4 in the nonvolatile memory device at S926, and end the operation.

FIG. 10 illustrates an operation of the electronic system 20 based on an embodiment of the disclosed technology.

Specifically, FIG. 10 illustrates transactions among the first switch controller SC1, the management logic 232 and the electronic device 300, which are performed when the state of the first energy storage component ESC1 is changed from the normal state through the warning state to the defect state.

When power is supplied to the auxiliary power supply 200 from the main power supply 100, the first switch controller SC1 may set the first switch SW1 to the switch on state at S1002. Although omitted in FIG. 10, the second to fourth switch controllers SC2 to SC4 may also set the second to fourth switches SW2 to SW4 to the switch on state. Step S1002 may correspond to step S802 described with reference to FIG. 8.

The management logic 232 may load the state information of the switches SW1 to SW4 and the plurality of thresholds associated with the channel current, the channel voltage and the channel temperature from the nonvolatile memory device included in the auxiliary power management device 230 at S1004. Step S1004 may correspond to step S902 described with reference to FIG. 9.

At S1006, the management logic 232 may provide the plurality of thresholds to the first switch controller SC1. Although not illustrated in FIG. 10, the management logic 232 may also provide the plurality of thresholds to the second to fourth switch controllers SC2 to SC4. Step S1006 may be performed when the electronic system 20 is booted, and performed even during an operation of the electronic system 20 when the plurality of thresholds are updated.

At S1008, the management logic 232 may provide the state information of the first switch SW1 to the first switch controller SC1. Similarly, the management logic 232 may also provide the state information of the second to fourth switches SW2 to SW4 to the second to fourth switch controllers SC2 to SC4. The operation of step S1008 may be performed in real time while the electronic system 20 normally operates, and correspond to step S806 described with reference to FIG. 8.

At S1010, the first switch controller SC1 may set the plurality of thresholds, obtained from the management logic 232, to the thresholds of the first channel current ICH1, the first channel voltage VCH1 and the first channel temperature TCH1. The first switch controller SC1 may control the first switch SW1 based on the state information of the first switch SW1, obtained from the management logic 232. Step S1010 may correspond to step S808. FIG. 10 illustrates the case in which the first switch SW1 is set to the switch on state.

At S1012, the first switch controller SC1 may detect the state of the first energy storage component ESC1, based on the plurality of thresholds and the first channel current ICH1, the first channel voltage VCH1 and the first channel temperature TCH1, which are detected in real time. The operation in which the first switch controller SC1 detects the state of the first energy storage component ESC1 has been described in detail with reference to FIGS. 3A to 3C, 4A to 4C, 5A, 5B, 6A, 6B and 7A to 7C. FIG. 10 illustrates the case in which the first switch controller SC1 detects the warning state of the first energy storage component ESC1.

At S1014, the first switch controller SC1 may change the switch on state of the first switch SW1 to the current-limited state.

At S1016, the first switch controller SC1 may provide an interrupt signal to the management logic 232. Step S1016 may correspond to step S818.

At S1018, the first switch controller SC1 may provide the state information of the first switch SW1 to the management logic 232. FIG. 10 illustrates that the first switch controller SC1 provides the state information of the first switch SW1 after providing the interrupt signal to the management logic 232. However, the operation in which the management logic 232 exchanges the state information with the switch controllers SC1 to SC4 may be performed in real time. The operation of step S1018 may correspond to steps S806 and S906.

At S1020, the management logic 232 may assert an interrupt to the electronic device 300 in response to the interrupt signal. Step S1020 may correspond to step S916.

At S1022, the management logic 232 may provide information to the electronic device 300, the information indicating that the state information of the first switch SW1 is the current-limited state. Step S1022 may correspond to step S920.

At S1024, the electronic device 300 may determine whether to change the state of the first switch SW1, which was changed to the current-limited state, to the switch off state. For example, when the first switch controller SC1 does not detect that the first energy storage component ESC1 is in the defect state, but detects that the warning state of the first energy storage component ESC1 lasts, the electronic device 300 may determine that the first energy storage component ESC1 has a defect which is not detected, and determine to change the state of the first switch SW1 to the switch off state.

At S1026, the electronic device 300 may provide information to the management logic 232, the information indicating that the state of the first switch SW1 is to be changed to the switch off state. Step S1026 may correspond to step S922.

At S1028, the management logic 232 may provide the state information from the electronic device 300 to the first switch controller SC1, and thus control the first switch controller SC1 to change the state of the first switch SW1 to the switch off state. FIG. 10 illustrates that the management logic 232 provides the state information to the first switch controller SC1, after the electronic device 300 provides the management logic 232 with the state information to be changed. However, the operation in which the management logic 232 exchanges the state information with the switch controllers SC1 to SC4 may be performed in real time. Step S1028 may correspond to steps S806 and S906.

At S1030, the first energy storage component ESC1 may change the state of the first switch SW1 to the switch off state based on the state information from the management logic 232.

The management logic 232 may detect a power down of the electronic system 20.

FIG. 10 illustrates that the management logic 232 detects a power down by receiving a power down signal from the electronic device 300 at S1032.

When detecting the power down of the electronic system 20, the management logic 232 may store the current state information of the switches SW1 to SW4 in the nonvolatile memory device described with reference to step S806, at S1034. For example, the management logic 232 may store information in the nonvolatile memory device, the information indicating that the first switch SW1 is in the switch off state. Step S1034 may correspond to step S926.

In some embodiments of the disclosed technology, the auxiliary power management device 230 may control the switches SW1 to SW4 based on the channel currents, the channel voltages and the channel temperatures of the respective channels CH1 to CH4 to which the energy storage components ESC1 to ESC4 and the switches SW1 to SW4 are coupled.

The auxiliary power management device 230 may detect the initial short circuit states and the open circuit states of the energy storage components by detecting whether asymmetries uneven current and/or voltage distribution among the channel currents ICH1 to ICH4 or asymmetries uneven current and/or voltage distribution among the channel voltages VCH1 to VCH4 last. Therefore, it is possible to prevent a situation in which the energy storage components are each determined to be in the initial short circuit state or the open circuit state, when the channel currents ICH1 to ICH4 or the channel voltages VCH1 to VCH4 temporarily increased due to external factors.

When an energy storage component is in the warning state, the auxiliary power management device 230 may determine the state of the switch, interworking with the energy storage component, as the current-limited state, thereby effectively control a current flowing to the energy storage component in the warning state.

The auxiliary power management device 230 may use the plurality of thresholds for the channel currents, the channel voltages and the channel temperatures to control the states of the switches SW1 to SW4. A user may easily change the plurality of thresholds by changing the resistance value of a resistor outside the auxiliary power management device 230 or the thresholds stored in the electronic device 300.

The auxiliary power management device 230 may store the state information of the switches SW1 to SW4 in the nonvolatile memory device when the electronic system 20 is powered down, and control the switches SW1 to SW4 based on the state information of the switches SW1 to SW4, stored in the nonvolatile memory device, when power is supplied to the electronic system 20 again. Therefore, it is possible to effectively control a current flowing into a defective energy storage component.

In some embodiments of the disclosed technology, the auxiliary power management device 230 may detect a defective energy storage component in real time, and control the current flowing to the energy storage component, thereby securing a sufficient charge quantity. The auxiliary power management device 230 may provide the auxiliary power AUX_PWR to the electronic device 300 based on the secured charge quantity upon sudden termination of power supply from the external power, thereby guaranteeing the integrity of the electronic device 300.

Figure 11:
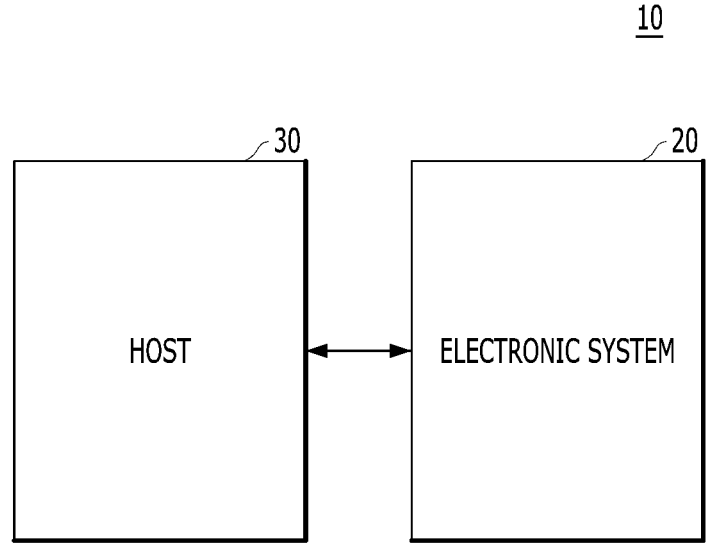
FIG. 11 illustrates an example of the electronic system 20 based on some embodiments of the disclosed technology.
Figure 12:
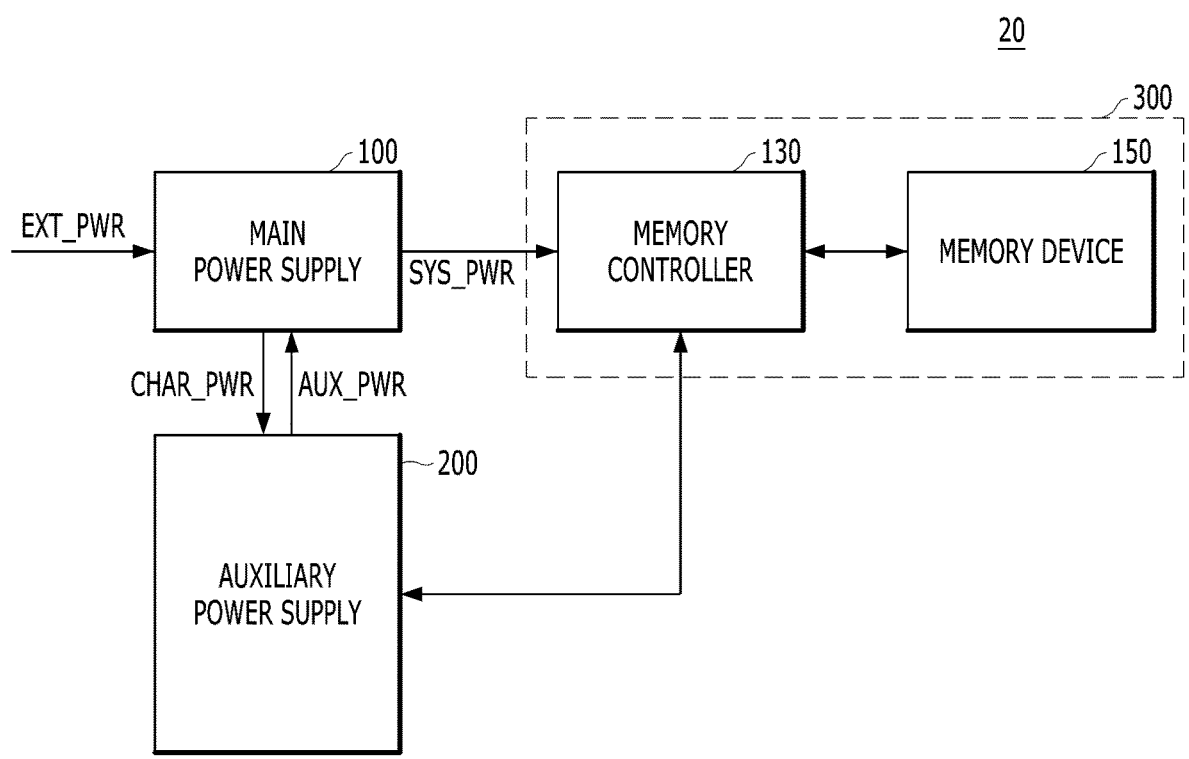
FIG. 12 illustrates another example of the electronic system 20 based on some embodiments of the disclosed technology.

FIGS. 11 and 12 illustrate examples of the electronic system 20 based on some embodiments of the disclosed technology in the case that the electronic device 300 is a storage device.

FIG. 11 illustrates a data processing system 10 including the electronic system 20.

The host 30 may include any of various portable electronic devices such as a mobile phone, MP3 player and laptop computer, or any of various non-portable electronic devices such as a desktop computer, a game machine, a television (TV), and a projector.

The host 30 may include at least one operating system (OS), which may manage and control overall functions and operations of the host 30, and provide operation between the host 30 and a user using the data processing system 10 or the electronic system 20. The OS may support functions and operations corresponding to the use purpose and usage of a user. For example, the OS may be divided into a general OS and a mobile OS, depending on the mobility of the host 30. The general OS may be divided into a personal OS and an enterprise OS, depending on the environment of a user.

The electronic system 20 may operate to store data for the host 30 in response to a request of the host 30. Non-limiting examples of the electronic system 20 may include a solid state drive (SSD), a multi-media card (MMC), a secure digital (SD) card, a universal serial bus (USB) device, a universal flash storage (UFS) device, compact flash (CF) card, a smart media card (SMC), a personal computer memory card international association (PCMCIA) card and memory stick. The MMC may include an embedded MMC (eMMC), reduced size MMC (RS-MMC) and micro-MMC, and the like. The SD card may include a mini-SD card and micro-SD card.

The electronic system 20 may be embodied by various types of storage devices. Examples of such storage devices may include, but are not limited to, volatile memory devices such as a dynamic random access memory (DRAM) and a static RAM (SRAM) and nonvolatile memory devices such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), resistive RAM (RRAM or ReRAM) and a flash memory. The flash memory may have a 3-dimensional (3D) stack structure.

The host 30 may include any of various portable electronic devices such as a mobile phone, MP3 player and laptop computer, or any of various non-portable electronic devices such as a desktop computer, a game machine, a television (TV), and a projector.

FIG. 12 illustrates the electronic system 20 when the electronic device 300 is a storage device.

The electronic system may include the main power supply 100, the auxiliary power supply 200 and the electronic device 300.

The main power supply 100 and the auxiliary power supply 200 may correspond to the main power supply 100 and the auxiliary power supply 200 described with reference to FIG. 1.

The electronic device 300 may include a memory controller 130 and a memory device 150.

The memory device 150 may be a nonvolatile memory device and may retain data stored therein even though power is not supplied. The memory device 150 may store data provided from the host 30 through a program operation, and provide data stored therein to the host 30 through a read operation. The memory device 150 may include a plurality of memory blocks each of which may include a plurality of pages, and each of the pages may include a plurality of memory cells coupled to a word line. In an embodiment, the memory device 150 may be a flash memory. The flash memory may have a 3-dimensional (3D) stack structure.

The memory controller 130 may control the memory device 150 in response to a request from the host 30. For example, the memory controller 130 may provide data read from the memory device 150 to the host 30, and store data provided from the host 30 into the memory device 150. For this operation, the memory controller 130 may control read, program and erase operations of the memory device 150.

The memory controller 130 and the memory device 150 may be integrated into a single semiconductor device. For example, the memory controller 130 and the memory device 150 may be integrated as one semiconductor device to constitute a solid state drive (SSD). When the electronic system 20 is used as an SSD, the operating speed of the host 30 connected to the electronic system 20 can be improved. In addition, the memory controller 130 and the memory device 150 may be integrated as one semiconductor device to constitute a memory card. For example, the memory controller 130 and the memory device 150 may constitute a memory card such as a personal computer memory card international association (PCMCIA) card, compact flash (CF) card, smart media (SM) card, memory stick, multimedia card (MMC) including reduced size MMC (RS-MMC) and micro-MMC, secure digital (SD) card including mini-SD card, micro-SD card and SDHC card, or universal flash storage (UFS) device.

Non-limiting application examples of the electronic system 20 may include a computer, an Ultra Mobile PC (UMPC), a workstation, a net-book, a Personal Digital Assistant (PDA), a portable computer, a web tablet, a tablet computer, a wireless phone, a mobile phone, a smart phone, an e-book, a Portable Multimedia Player (PMP), a portable game machine, a navigation system, a black box, a digital camera, a Digital Multimedia Broadcasting (DMB) player, a 3-dimensional television, a smart television, a digital audio recorder, a digital audio player, a digital picture recorder, a digital picture player, a digital video recorder, a digital video player, a storage device constituting a data center, a device capable of transmitting/receiving information in a wireless environment, one of various electronic devices constituting a home network, one of various electronic devices constituting a computer network, one of various electronic devices constituting a telematics network, a Radio Frequency Identification (RFID) device, or one of various components constituting a computing system.

The main power supply 100 may receive the external power EXT_PWR supplied from the host 30, and provide power for driving the memory controller 130 and a program voltage, a read voltage and an erase voltage of the memory device 150. The main power supply 100 may receive the external power EXT_PWR and charge the auxiliary power supply 200.

The supply of the external power EXT_PWR from the host 30 may be suddenly cut off. For example, the memory controller 130 may encounter a sudden termination of power supply from the external power EXT_PWR while buffering write data in an internal memory thereof, the write data having been received from the host 30 with a write request, but not being yet programmed to the memory device 150.

In some embodiments of the disclosed technology, the auxiliary power supply 200 may detect a defective energy storage component in real time while the electronic system 20 normally operates, and control a current flowing to the energy storage component, such that the energy storage component set 210 is normally charged. The memory controller 130 may not control the current flowing to the energy storage component in real time, and control the current flowing to the energy storage component when the auxiliary power supply 200 asserts an interrupt. Since the resource consumption of the memory controller 130 to control the current flowing to the energy storage component is reduced, the data input/output performance of the electronic system 20 may be improved.

In a case of a sudden termination of power supply from the external power, the main power supply 100 may supply the auxiliary power AUX_PWR of the auxiliary power supply 200 as the system power SYS_PWR of the electronic device 300. When the energy storage component set 210 is normally charged, the memory controller 130 may program the write data to the memory device 150 using the system power SYS_PWR before the electronic system 20 is powered down. Therefore, the integrity of the electronic system 20 for a request of the host 30 may be guaranteed.

Although various embodiments have been described for illustrative purposes, variations or enhancements to the disclosed embodiments and other embodiments can be made based on what is disclosed in this patent document.

What is claimed is:

1. An auxiliary power management device coupled to an auxiliary power source that serves as a backup power supply for a primary power source to provide power to an electronic device, wherein the auxiliary power management device comprises:
a plurality of switches to control currents of a plurality of energy storage components;
a plurality of channels, each channel coupling each of the plurality of switches to each of the plurality of energy storage components;
a plurality of switch controllers, each switch controller configured to monitor a current or voltage at each channel and control each of the plurality of switches based on the current or voltage monitored at each channel between each switch and each energy storage component of the plurality of channels;
a nonvolatile memory device to store state information of the plurality of switches coupled to the plurality of channels upon termination of power supply from the primary power source; and
a management logic to control the plurality of switches upon detection, by the plurality of switch controllers, of whether a current or voltage distribution across at least one of the plurality of channels exceeds a first threshold,
wherein when the primary power source resumes power supply, the management logic obtains the state information of the switch from the nonvolatile memory device, and provides the state information to a corresponding switch controller, and
each of the plurality of switch controllers sets the corresponding switch coupled to the corresponding channel to an on state, and sets a state of the corresponding switch based on the state information received from the management logic.

2. The auxiliary power management device of claim 1, wherein the detection of the current or voltage distribution includes determining whether a number of channels that carry a current higher than a first threshold current and lower than a warning threshold current is equal to or less than a predetermined number for a predetermined period of time, and wherein the management logic controls one or more of the switch controllers corresponding to one or more of the switches coupled to one or more of the channels that carry the current higher than the first threshold current and lower than the warning threshold current to switch off the one or more switches.

3. The auxiliary power management device of claim 2, wherein the detection of the current or voltage distribution includes determining whether a number of switches having a voltage lower than a second threshold corresponding to a threshold defining a range of a normal voltage level is equal to or less than a predetermined number for a predetermined period of time, and wherein the management logic controls one or more of the switch controllers to switch off one or more of the switches that have the voltage lower than the second threshold.

4. The auxiliary power management device of claim 1, wherein each of the plurality of switches is in the on state, a current-limited state, or an off state, based on at least one of the current, the voltage and the temperature of the corresponding channel,
wherein the corresponding switch has a higher resistance value in the current limited state than in the on state.

5. The auxiliary power management device of claim 4, wherein the management logic obtains state information of the energy storage components corresponding to the plurality of channels from the plurality of switch controllers in response to interrupt signals from the plurality of switch controllers.

6. The auxiliary power management device of claim 5, wherein each of the plurality of switch controllers monitors the current, the voltage and the temperature of the corresponding channel even when the corresponding switch is switched off, determines that the corresponding energy storage component is in a normal state, a warning state requiring a warning, or a defect state indicating the corresponding energy storage component has a defect, based on the monitoring of the current, the voltage and the temperature, and provides the state information of the energy storage component to the management logic.

7. The auxiliary power management device of claim 4, wherein each of the plurality of switch controllers controls a state of the corresponding switch based on a plurality of thresholds for the current, the voltage and the temperature of the corresponding channel, and the management logic obtains the plurality of thresholds from an external device or an external resistance value, and provides the plurality of thresholds to the switch controllers.

8. The auxiliary power management device of claim 1, wherein the switch is a low-side switch.

9. An electronic system comprising:
an electronic device;
an auxiliary power supply comprising a plurality of channels coupling a plurality of energy storage components to a plurality of switches, wherein the auxiliary power supply is configured to control the plurality of switches based on whether a current or voltage distribution detected at each of the plurality of channels between each switch and each energy storage component exceeds a predetermined threshold; and
a main power supply to charge the auxiliary power supply using a primary power source during a normal operation, the main power supply providing auxiliary power of the auxiliary power supply to the electronic device upon sudden termination of the primary power source, wherein the auxiliary power supply further comprises:
a plurality of switch controllers to monitor a current, a voltage and a temperature of a corresponding channel, and control a corresponding switch coupled to a corresponding channel;
a nonvolatile memory device to store state information of the plurality of switches coupled to the plurality of channels upon termination of power supply from the primary power source; and
a management logic to obtain the state information of a corresponding switch from the nonvolatile memory device and provide the state information to a corresponding switch controller, when the primary power source resumes power supply,
wherein each of the plurality of switch controllers sets the corresponding switch coupled to a corresponding channel to an on state, and sets a state of the corresponding switch based on the state information received from the management logic.

10. The electronic system of claim 9, wherein
the management logic detects the current or voltage distribution across the channels by determining whether a number of channels that carry a current higher than a first threshold current and lower than a warning threshold current is equal to or less than a predetermined number for a predetermined period of time, and controls one or more of the switch controllers corresponding to one or more of the switches coupled to one or more of the channels that carry the current higher than the first threshold current and lower than the warning threshold current to switch off the one or more switches.

11. The electronic system of claim 10, wherein the auxiliary power supply is configured to determine whether a number of switches having a voltage lower than a second threshold corresponding to a threshold defining a range of a normal voltage level is equal to or less than a predetermined number for a predetermined period of time, and wherein the management logic switches off one or more of the switches that have the voltage lower than the second threshold.

12. The electronic system of claim 9, wherein each of the plurality of switches is in the on state, a current-limited state, or an off state, based on at least one of the current, the voltage and the temperature of the corresponding channel,
wherein the corresponding switch has a higher resistance value in the current-limited state than in the on state.

13. The electronic system of claim 12, wherein the management logic is suitable for obtaining state information of the energy storage components corresponding to the plurality of channels from the plurality of switch controllers in response to interrupt signals from the plurality of switch controllers.

14. The electronic system of claim 13, wherein the management logic indicates an interrupt for an energy storage component in a warning state requiring a warning, among the energy storage components of the plurality of channels, to the electronic device, and
the electronic device provides a control signal to the management logic to change a state of the switch corresponding to the energy storage component to the off state, upon a detection of the warning state of the energy storage component based on the interrupt.

15. The electronic system of claim 13, wherein each of the plurality of switch controllers monitors the current, the voltage and the temperature of the corresponding channel even when the corresponding switch is switched off, determines that the corresponding energy storage component is in a normal state, a warning state requiring a warning, or a defect state indicating the corresponding energy storage component has a defect based on the monitoring of the current, the voltage and the temperature, and provides the state information of the energy storage component to the management logic.

16. The electronic system of claim 15, wherein the management logic indicates an interrupt for an energy storage component corresponding to a switch in the off state, to the electronic device when the energy storage component is in the defect state, and
the electronic device provides a warning signal to a user based on the interrupt.

17. The electronic system of claim 12, wherein each of the plurality of switch controllers controls a state of the corresponding switch based on a plurality of thresholds for the current, the voltage and the temperature of the corresponding channel, and
the management logic obtains the plurality of thresholds from an external device or an external resistance value, and provides the plurality of thresholds to the switch controllers.

18. The electronic system of claim 9, wherein the switch is a low-side switch.

* * * * *